(12) United States Patent
Kato et al.

(10) Patent No.: US 9,466,483 B2
(45) Date of Patent: Oct. 11, 2016

(54) FILM DEPOSITION APPARATUS AND FILM DEPOSITION METHOD

(71) Applicant: Tokyo Electron Limited, Tokyo (JP)

(72) Inventors: Hitoshi Kato, Iwate (JP); Shigehiro Miura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 147 days.

(21) Appl. No.: 13/943,919

(22) Filed: Jul. 17, 2013

(65) Prior Publication Data
US 2014/0024200 A1 Jan. 23, 2014

(30) Foreign Application Priority Data
Jul. 20, 2012 (JP) ................. 2012-161817

(51) Int. Cl.
*H01L 21/02* (2006.01)
*C23C 16/455* (2006.01)
*C23C 16/46* (2006.01)
(Continued)

(52) U.S. Cl.
CPC ..... *H01L 21/02617* (2013.01); *C23C 16/4554* (2013.01); *C23C 16/45551* (2013.01); *C23C 16/46* (2013.01); *H01J 37/32724* (2013.01); *H01J 37/32733* (2013.01); *H01J 37/32899* (2013.01); *H01L 21/0217* (2013.01); *H01L 21/0228* (2013.01); *H01L 21/02164* (2013.01); *H01L 21/02274* (2013.01); *H01L 21/67115* (2013.01); *H01L 21/68764* (2013.01); *H01L 21/68771* (2013.01); *H01L 21/0262* (2013.01); *H01L 21/02532* (2013.01)

(58) Field of Classification Search
CPC ................. H01L 21/02617; H01L 21/68764; H01L 21/67115; H01L 21/68771; H01L 21/02274; H01J 21/0228; H01J 21/02164; H01J 21/0262; H01J 21/02352; H01J 21/0217; H01J 37/32899; H01J 37/32733; H01J 37/32724; C23C 16/4554; C23C 16/4551; C23C 16/46
USPC ........................................................ 438/788
See application file for complete search history.

(56) References Cited

U.S. PATENT DOCUMENTS 8,034,723 B2 * 10/2011 Ohizumi ........... C23C 16/45551
118/712
2008/0280417 A1 * 11/2008 Yamazaki ........... H01L 21/3081
438/433

(Continued)

FOREIGN PATENT DOCUMENTS

CN   102002685   4/2011
JP   10-079377   3/1998
(Continued)

*Primary Examiner* — Michael Trinh
(74) *Attorney, Agent, or Firm* — IPUSA, PLLC

(57) ABSTRACT

A film deposition apparatus includes a turntable to rotate a substrate thereon, a process gas supply part to supply a process gas to form a thin film on the substrate, a heating part to heat the substrate up to a predetermined film deposition temperature to form a thin film, a plasma treatment part to treat the thin film for modification, a heat lamp provided above the turntable and configured to heat the substrate up to a temperature higher than the predetermined film deposition temperature by irradiating the substrate with light in an adsorption wavelength range of the substrate, and a control part to output a control signal so as to repeat a step of depositing the thin film and a step of modifying the thin film by the plasma, and then to stop supplying the process gas and to heat the substrate by the heat lamp.

4 Claims, 15 Drawing Sheets

(51) Int. Cl.
*H01J 37/32* (2006.01)
*H01L 21/67* (2006.01)
*H01L 21/687* (2006.01)

(56) References Cited

U.S. PATENT DOCUMENTS

| | | | | |
|---|---|---|---|---|
| 2010/0132615 | A1* | 6/2010 | Kato | C23C 16/402 118/725 |
| 2010/0260935 | A1* | 10/2010 | Kato | H01L 21/67115 427/255.28 |
| 2011/0048326 | A1 | 3/2011 | Kato et al. | |
| 2012/0222615 | A1* | 9/2012 | Kato | H01L 21/68764 118/719 |
| 2013/0047923 | A1* | 2/2013 | Kato | H01L 21/02164 118/723 AN |
| 2014/0011369 | A1* | 1/2014 | Kato | H01L 21/02233 438/771 |

FOREIGN PATENT DOCUMENTS

| JP | 2010-245448 | 10/2010 |
|---|---|---|
| JP | 2011-040574 | 2/2011 |

* cited by examiner

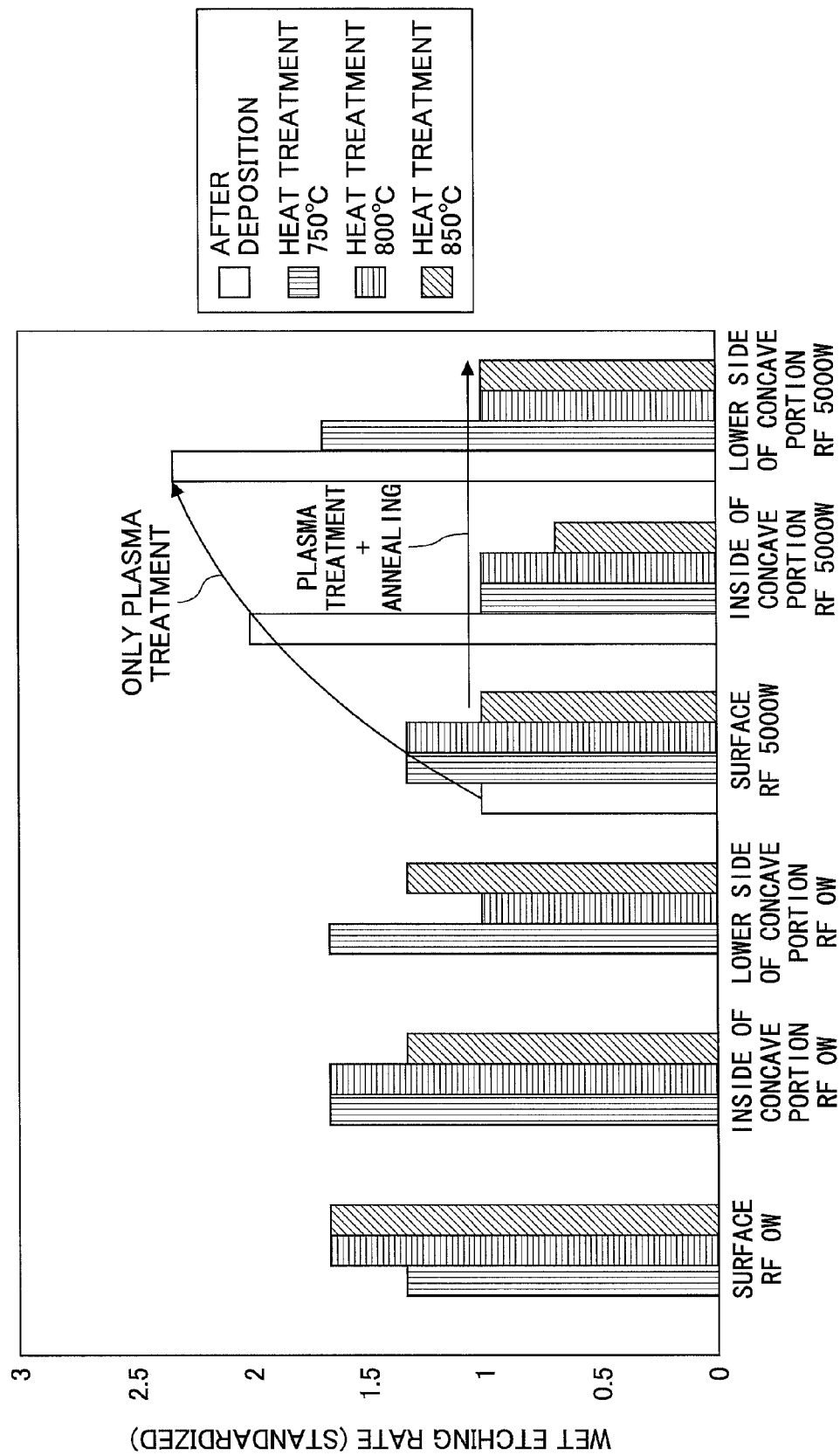

FILM DEPOSITION APPARATUS AND FILM DEPOSITION METHOD

CROSS-REFERENCE TO RELATED APPLICATIONS

This patent application is based upon and claims the benefit of priority of Japanese Patent Application No. 2012-161817, filed on Jul. 20, 2012, the entire contents of which are incorporated herein by reference.

BACKGROUND OF THE INVENTION

1. Field of the Invention

The present invention relates to a film deposition apparatus and a film deposition method that deposit a thin film on a substrate.

2. Description of the Related Art

An ALD (Atomic Layer Deposition) method is known, for example, as one of the methods of depositing a thin film such as a silicon oxide film (i.e., $SiO_2$) on a substrate such as a semiconductor wafer (which is called a "wafer" hereinafter), as disclosed in Japanese Patent Application Laid-Open Publication No. 2011-40574. In this apparatus, five wafers are arranged on a turntable in a circumferential direction, and a plurality of gas nozzles is arranged above the turntable. The apparatus deposits a reaction product on the wafers in a layer-by-layer manner by supplying a plurality of kinds of reaction gases that react with each other on the respective rotating wafers. Moreover, in the apparatus, a thin film is densified by providing a member for performing a plasma modification at a location away from the gas nozzles in the circumferential direction and by performing the plasma modification process to each reaction product deposited on the wafer in a layer-by-layer manner.

However, a dense thin film may not be deposited to the degree of meeting required specifications, depending on the type of device on which such a silicon oxide film is deposited, even though the plasma modification is performed. More specifically, when a concave portion having a high aspect ratio that exceeds, for example, dozens or one hundred, such as a hole or a groove (i.e., trench) is formed in a surface of the wafer, a degree of the modification may vary in a depth direction of the concave portion. In other words, when such a concave portion with the high aspect ratio is formed, the plasma (which is more specifically, argon ions) is unlikely to go into the concave portion. Moreover, because the plasma treatment and the film deposition process are performed together in a vacuum chamber, a process pressure in the vacuum chamber is higher than a vacuum atmosphere in which the plasma can remain active preferably. Due to this, the plasma is likely to be deactivated when the plasma contacts an inner wall of the concave portion, which also causes the degree of modification to vary in the depth direction of the concave portion.

Japanese Patent Application Laid-Open Publication No. 2010-245448 discloses a configuration that provides a heat lamp to perform an annealing treatment in a location away from each nozzle in a circumferential direction in such an apparatus, but specific film quality of a thin film is not considered. Japanese Patent Application Laid-Open Publication No. 10-79377 discloses a device that performs a modification treatment together with a film deposition process, but the above-mentioned problem is not described.

SUMMARY OF THE INVENTION

Embodiments of the present invention provide a novel and useful film deposition apparatus and film deposition method solving one or more of the problems discussed above.

More specifically, embodiments of the present invention provide a film deposition apparatus and a film deposition method that can deposit a high-quality thin film in a depth direction of a concave portion even when the concave portion is formed in a surface of a substrate in depositing the thin film on the substrate being rotated by a turntable.

According to one embodiment of the present invention, there is provided a film deposition apparatus configured to perform a film deposition process on a substrate in a vacuum chamber. The film deposition apparatus includes a turntable configured to rotate a substrate receiving area to receive the substrate, a process gas supply part configured to supply a process gas in a process area to form a thin film by depositing at least one of a molecular layer and an atomic layer in a layer-by-layer manner on the substrate along with a rotation of the turntable, a heating part to heat the substrate up to a predetermined film deposition temperature to form a thin film, a plasma treatment part provided away from the process gas supply part in a rotational direction of the turntable and configured to treat the at least one of the molecular layer and the atomic layer for modification by plasma generated by converting a plasma generating gas to the plasma, a heat lamp provided above the turntable so as to face a passing area of the substrate on the turntable and configured to heat the substrate up to a predetermined modification temperature higher than the predetermined film deposition temperature for modifying the thin film by irradiating the substrate with light in an adsorption wavelength range of the substrate, and a control part configured to output a control signal so as to repeat a first step of depositing the at least one of the molecular layer and the atomic layer and a second step of modifying the at least one of the molecular layer and the atomic layer by the plasma, and then to stop supplying the process gas and to heat the substrate by the heat lamp.

According to another embodiment of the present invention, there is provided a film deposition method to deposit a thin film on a substrate. The film deposition method includes steps of placing a substrate on a substrate receiving area on a turntable provided in a vacuum chamber, the substrate including a concave portion formed in a surface thereof, rotating the substrate receiving area by rotating the turntable, heating the substrate on the turntable up to a predetermined film deposition temperature to deposit a thin film, depositing the thin film on the substrate by repeating a first step of forming at least one of a molecular layer and an atomic layer on the substrate by supplying a process gas from a process gas supply part to the substrate on the turntable, and a second step of modifying the at least one of the molecular layer and the atomic layer by plasma, by supplying a plasma generating gas into the vacuum chamber and by converting the plasma generating gas to plasma in a plasma treatment part, and modifying the thin film by heating the substrate up to a temperature higher than the predetermined film deposition temperature.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 18 is a property diagram showing an experiment performed in an embodiment of the present invention.

DETAILED DESCRIPTION OF THE PREFERRED EMBODIMENTS

A description is given below of an example of a film deposition apparatus of an embodiment of the present invention, with reference to FIGS. 1 through 9. As shown in FIGS. 1 through 4, this film deposition apparatus includes a vacuum chamber 1 having an approximately circular planar shape, and a turntable 2 provided in the vacuum chamber 1, having a rotational center that coincides with a center of the vacuum chamber 1, and made of an insulator such as quartz. The film deposition apparatus is configured to perform a deposition process of a thin film on a wafer W made of silicon (Si). The film deposition apparatus, as described below, even when a concave portion having an aspect ratio of ten or more to two hundred or less such as dozens of aspect ratio or more than one hundred aspect ratio is formed in a surface of the wafer W, is configured to deposit a dense and homogeneous thin film throughout a depth direction of the concave portion. Subsequently, a description is given of respective parts of the film deposition apparatus.

Figure 1:
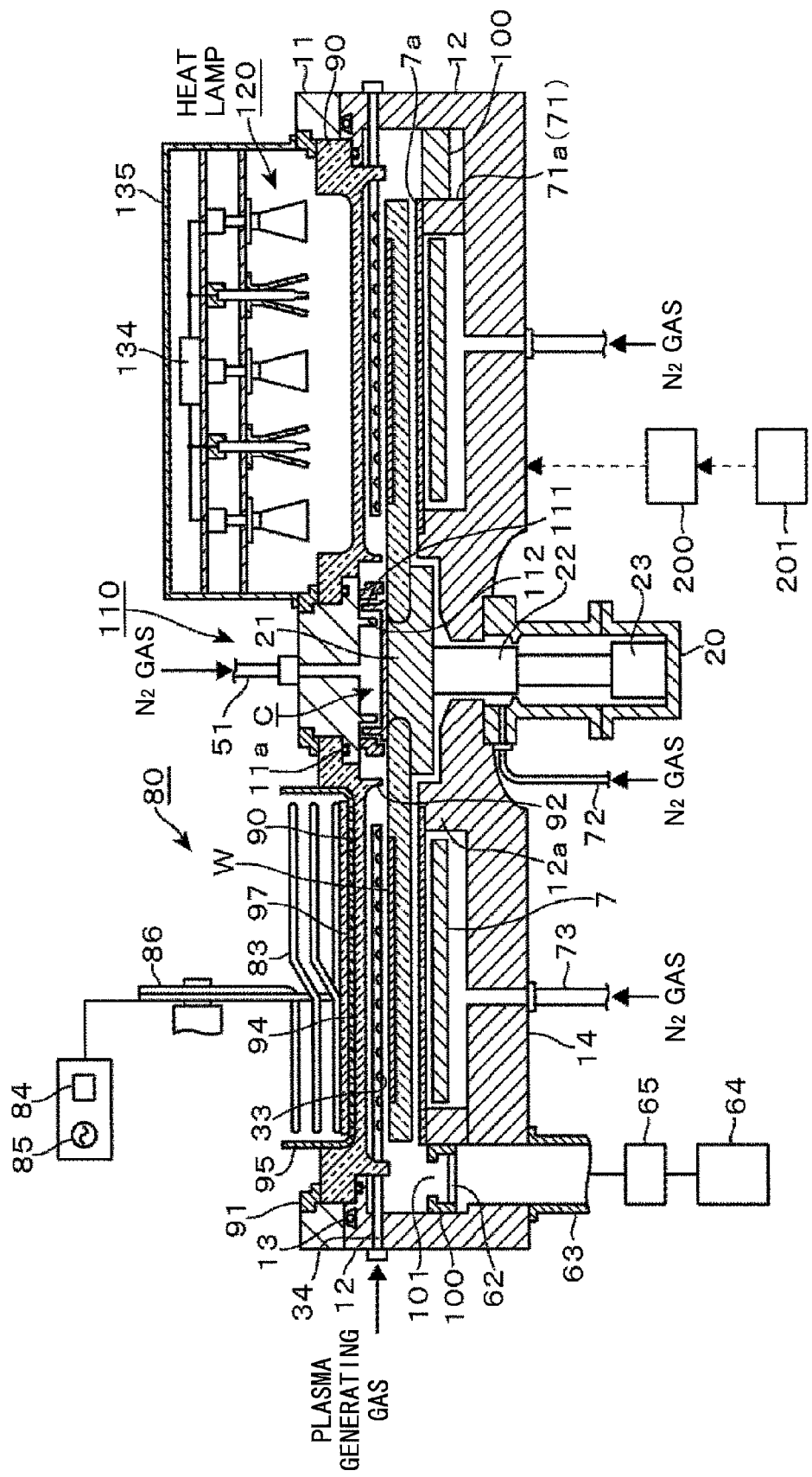
FIG. 1 is a vertical cross-sectional side view illustrating an example of a film deposition apparatus of an embodiment of the present invention.

The vacuum chamber 1 includes a ceiling plate 11 and a chamber body 12, and the ceiling plate 11 is configured to be attachable to and detachable from the chamber body 12. A separation gas supply pipe 51 for supplying a nitrogen ($N_2$) gas as a separation gas is connected to a center portion in an upper surface of the ceiling plate 11 to prevent different process gases from being mixed with each other in a center area C in the vacuum chamber 1. In FIG. 1, a seal member, for example, an O-ring 13 is provided in a periphery in an upper surface of the chamber body 12. Moreover, in FIG. 2, a camera unit 10a is provided to detect the wafer W on a transfer arm 10 carried into the vacuum chamber 1 through a transfer opening 15 described below. Furthermore, although depiction is omitted in the respective drawings, a temperature detection part, for example, made of a radiation thermometer and the like is provided on or above the ceiling plate 11 located away from the camera unit 10a in a circumferential direction to detect a temperature of the wafer W on the turntable 2 through a transparent window fitted in the ceiling plate 11.

The turntable 2 is fixed to a core portion 21 having an approximately cylindrical shape at the center portion, and is configured to be rotatable by a rotational shaft 22 connected to a lower surface of the core portion 21 and extending in a vertical direction, around the vertical axis in a clockwise direction in this example. In FIG. 1, a drive part (i.e. a rotation mechanism) 23 is provided to rotate the rotational shaft 22 around the vertical axis, and a case body 20 houses the rotational shaft 22 and the drive part 23. A flange part on the upper surface side of the case body 20 is hermetically attached to the lower surface of the bottom portion 14 of the vacuum chamber 1. Furthermore, a purge gas supply pipe 72 for supplying a nitrogen gas as a purge gas to a lower area of the turntable 2 is connected to the case body 20. The outer circumference of the core portion 21 in the bottom portion 14 of the vacuum chamber 1 is formed in a ring shape so as to extend from the lower side, and forms a protrusion portion 12a.

As shown in FIG. 1, a heater unit 7 that is a heating part is provided above a bottom portion 14 of the vacuum chamber 1, and is configured to heat the wafer W on the turntable 2 through the turntable 2 up to a film deposition temperature, for example, 300 to 650 degrees Celsius. In FIG. 1, a cover member 71a is provided on the lateral side of the heater unit 7, and a covering member 7a covers the heater unit 7 from the above. Moreover, a purge gas supply pipe 73 for purging a space in which the heater unit 7 is arranged is provided at a plurality of positions along a circumferential direction in the bottom portion 14 under the heater unit 7.

Figure 3:
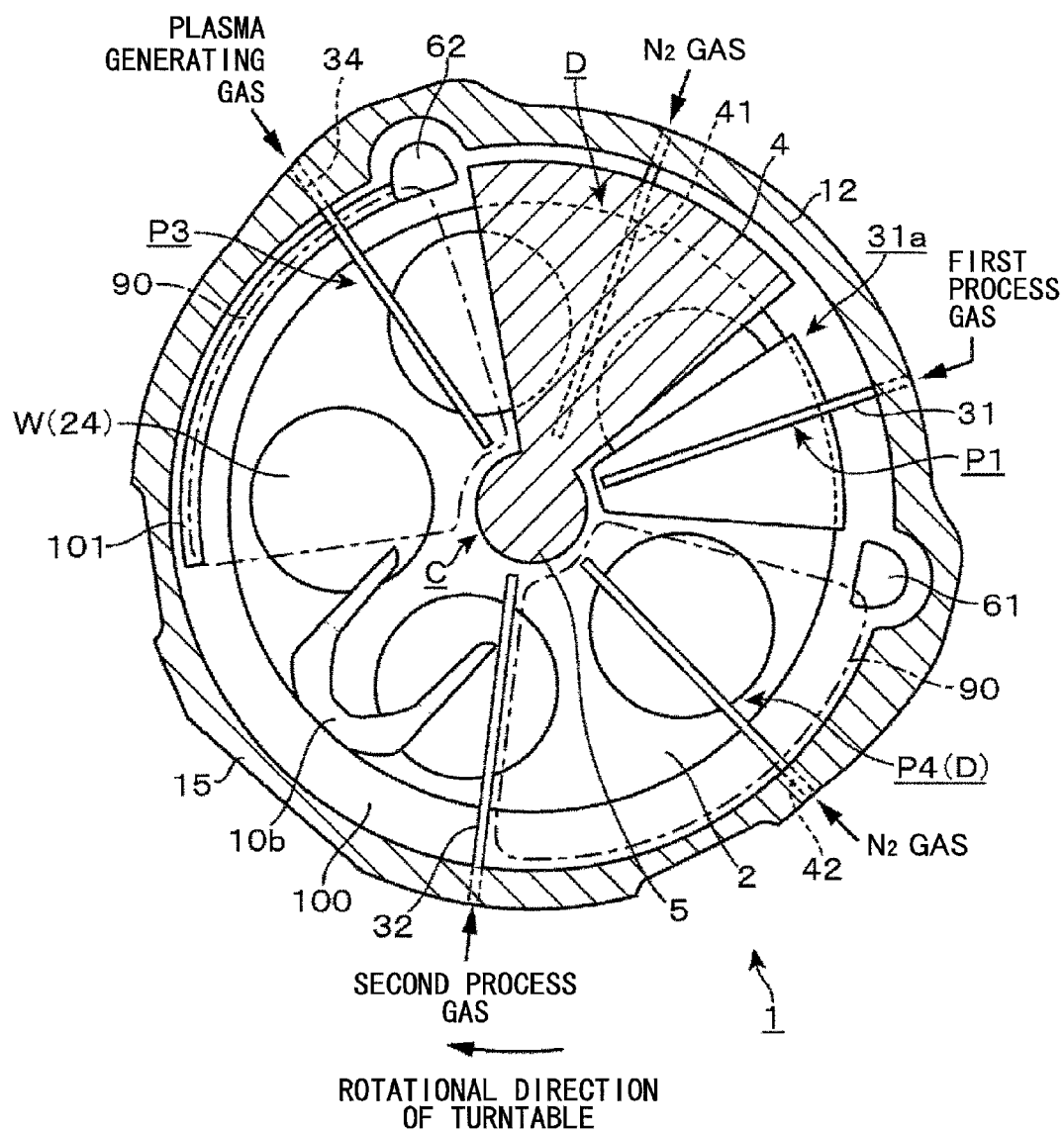
FIG. 3 is a first horizontal cross-sectional plan view illustrating the film deposition apparatus.
Figure 4:
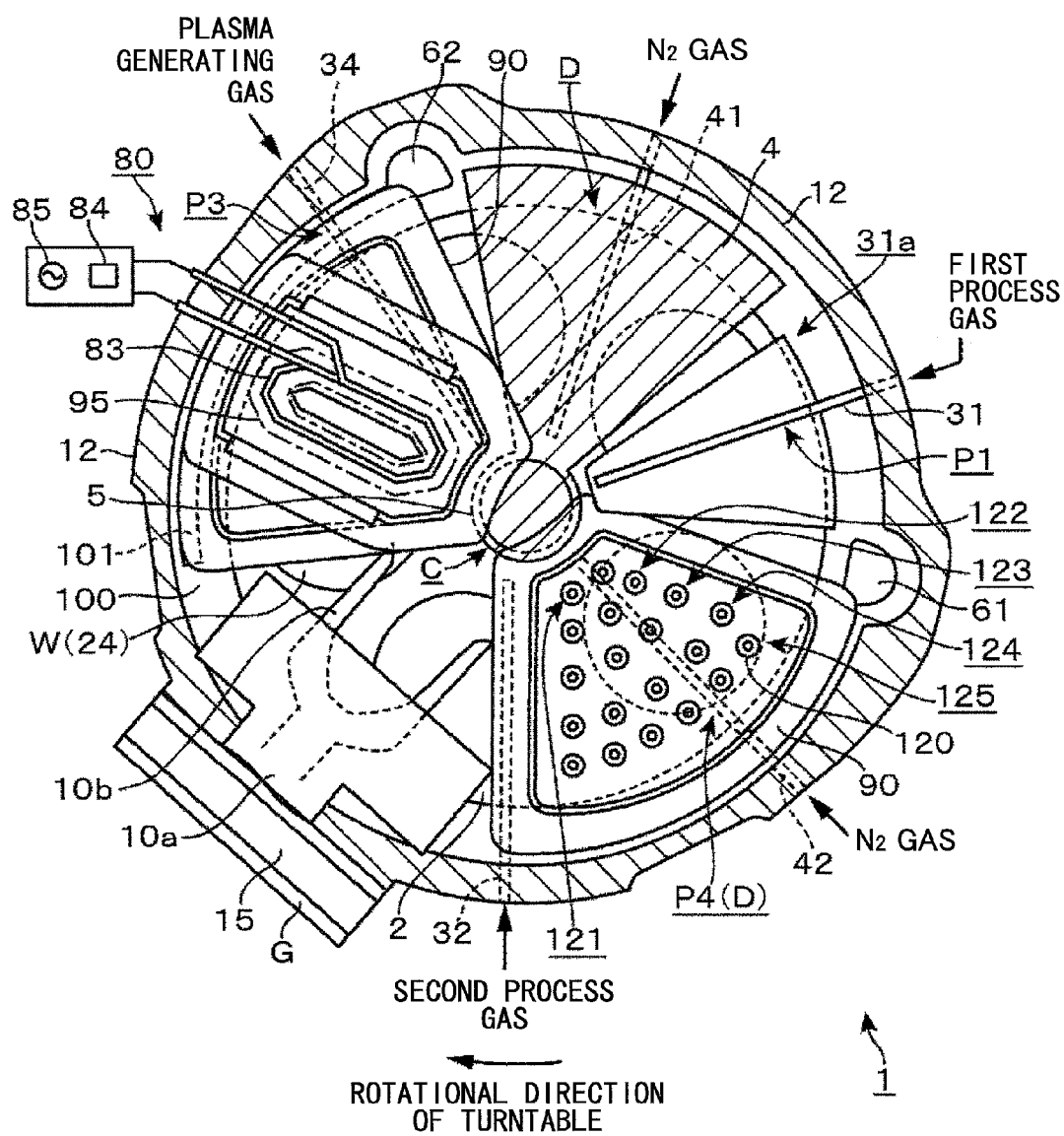
FIG. 4 is a second horizontal cross-sectional plan view illustrating the film deposition apparatus.

As shown in FIGS. 3 and 4, circular concave portions 24 are provided as a substrate receiving area to hold the wafer W by laying down the wafer W therein. The concave portions 24 are formed at a plurality of locations, for example, at five locations along a rotational direction (i.e., circumferential direction) of the turntable 2. Five nozzles 31, 32, 34, 41 and 42 each made of, for example, quartz are arranged in a radial fashion at intervals in the circumferential direction of the vacuum chamber 1 at respective positions opposite to a passing area of the concave portions 24. These respective nozzles 31, 32, 34, 41 and 42 are each installed, for example, so as to horizontally extend facing the wafer W from the outer peripheral wall of the vacuum chamber 1 toward the center area C. In this example, the plasma generating gas nozzle 34, the separation gas nozzle 41, the first process gas nozzle 31, the separation gas nozzle 42, and the second process gas nozzle 32 are arranged in this order in a clockwise fashion (i.e., the rotational direction of the turntable 2) when seen from a transfer opening 15 described below.

Figure 2:
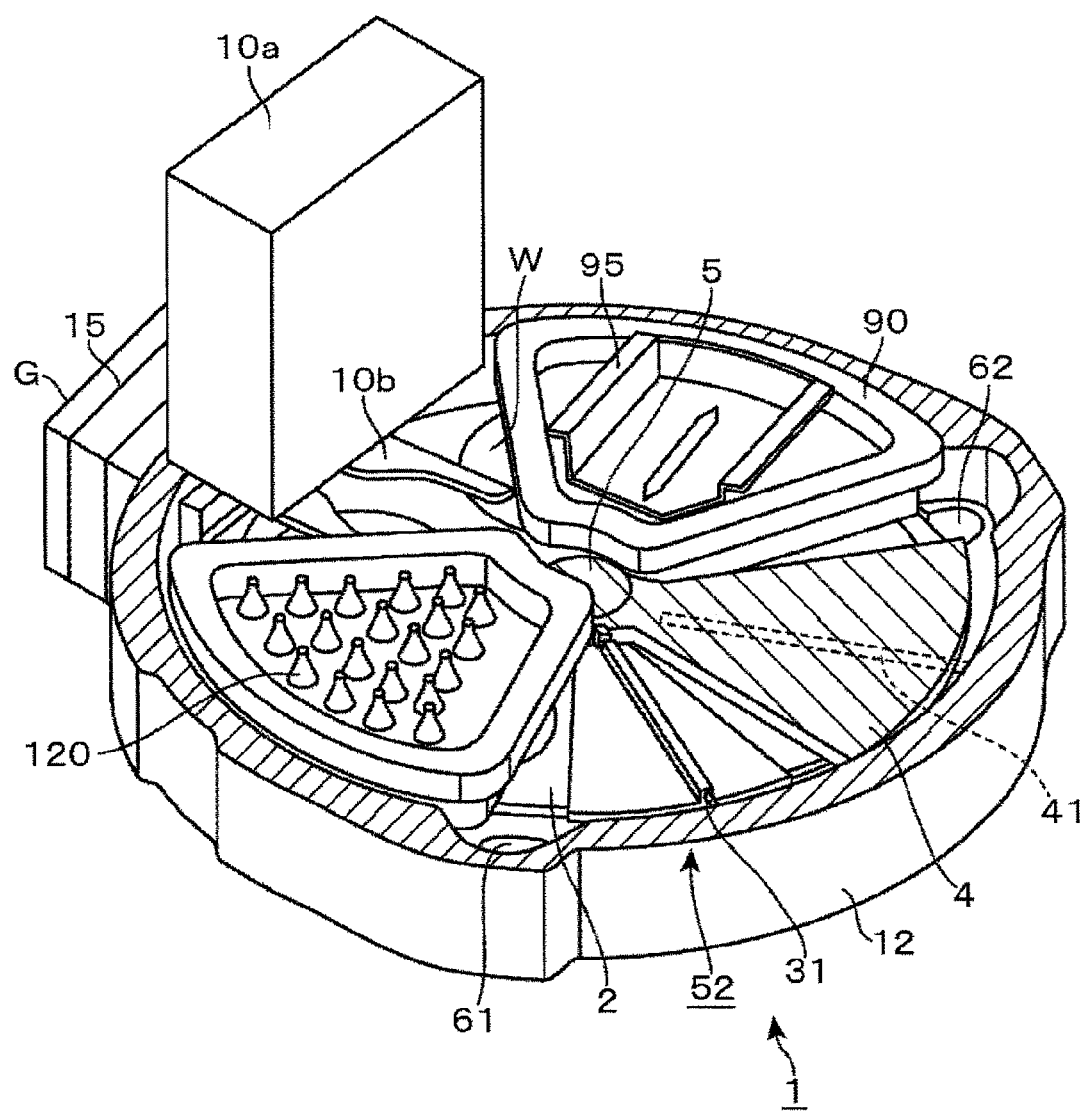
FIG. 2 is a perspective view of the film deposition apparatus.

The process gas nozzles 31 and 32 respectively form a first process gas supply part and a second process gas supply part, and the plasma generating gas nozzle 34 forms a plasma generating gas supply part. In addition, the separation gas nozzles 41 and 42 respectively form separation gas supply parts. Here, FIG. 3 illustrates a state of a plasma treatment part 80, a casing 90 and a heat lamp 120 described below removed from the chamber body 12 so as to make the nozzles 34 and 42 visible. FIG. 4 illustrates a state of the plasma treatment part 80, the casing 90 and the heat lamp 120 installed in the chamber body 12. Moreover, FIG. 2 illustrates a state of the turntable 2 also removed from the chamber body 12.

The respective nozzles 31, 32, 34, 41 and 42 are connected to the following respective gas sources (not shown in the drawings) through a flow rate controlling valve. That is to say, the first process gas nozzle 31 is connected to a supply source of a first process gas containing Si (silicon) such as BTBAS (Bis(tertiary-butyl-amino)silane), $SiH_2$ ($NH—C(CH_3)_3)_3)_2$ gas or the like. The second process gas nozzle 32 is connected to a supply source of second process gas such as a mixed gas of an ozone ($O_3$) gas and an oxygen ($O_2$) gas (which is more specifically an oxygen gas supply source including an ozonizer). The plasma generating gas nozzle 34 is connected to a supply source of a plasma generating gas composed of a mixed gas, for example, of an argon (Ar) gas and an oxygen gas. The separation gas nozzles 41 and 42 are respectively connected to a gas supply source of a nitrogen gas that is the separation gas. A plurality of gas discharge holes 33 is respectively formed, for example, in the lower surfaces of these gas nozzles 31, 32, 34, 41 and 42, and is arranged at a plurality of locations along the radial direction of the turntable 2, for example, at regular intervals. In FIG. 3, a nozzle cover (fin) 31a is provided above the first process gas nozzle 31 to circulate the gas discharged from the nozzle 31 along the surface of the wafer W.

Figure 5:
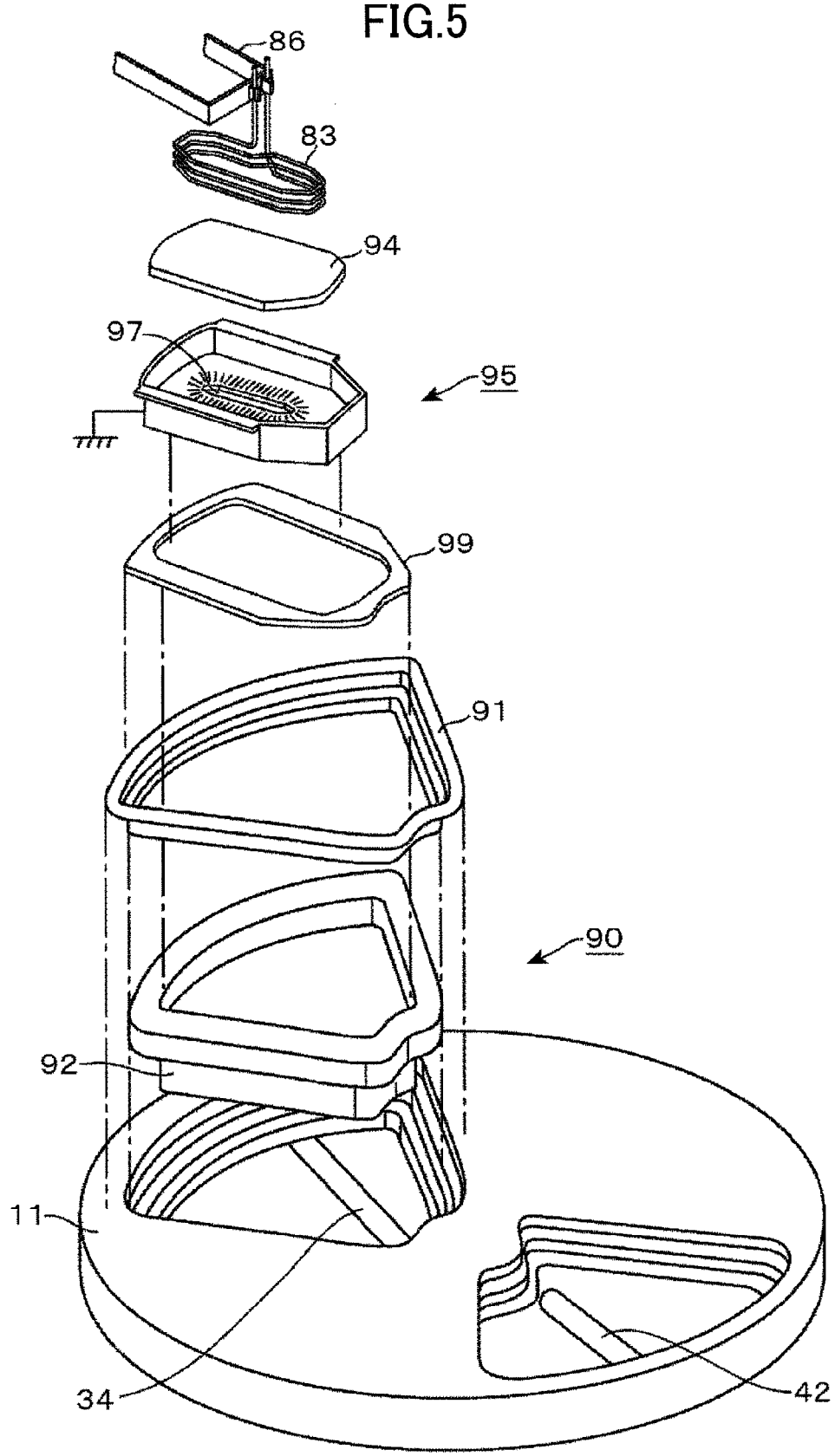
FIG. 5 is an exploded perspective view illustrating a plasma treatment part of the film deposition apparatus.

Areas under the process gas nozzles 31 and 32 respectively become a first process area P1 (a film deposition area) to adsorb the first process gas on the wafer W, and a second process area P2 to react a second process gas with a component of the first process gas adsorbed on the wafer W. An area below the plasma generating gas nozzle 34, as described below, becomes a modification area P3 to perform a plasma modification treatment on the wafer W. More specifically, as illustrated in FIGS. 1, 4 and 5, a plasma generating part 80 configured by winding around an antenna 83 made of a metal wire in a coil form, is provided above the plasma generating gas nozzle 34 to convert the plasma generating gas supplied from the plasma generating gas nozzle 34 into plasma. In FIG. 2, depiction of the plasma generating part 80 is omitted.

As illustrated in FIG. 4, the antenna 83 is arranged to cross the passing area of the wafer W from the center portion side to the outer edge side of the turntable 2 as seen from a planar perspective. The antenna 83 forms an approximate octagon shape so as to surround a zonal area extending along the radial direction of the turntable 2. Moreover, the antenna 83 is connected to a radio frequency power source 85 of an output power of, for example, 5000 W with a frequency of, for example, 13.56 MHz through a matching box 84, and is arranged to be hermetically zoned from the inside area of the vacuum chamber 1.

More specifically, the ceiling plate 11 above the plasma generating gas nozzle 34 is open to form an approximate sector shape as seen from a planar perspective, and the opening is hermetically blocked by the casing 90 made of, for example, quartz and the like. This casing 90 includes a periphery portion that horizontally extends throughout the circumference in a flange form, and a central part formed to be depressed toward the inner area of the vacuum chamber 1, and houses the antenna 83 therein. In FIG. 1, a seal member 11a is provided between the casing 90 and the ceiling plate 11, and a pressing member 91 is provided to press the periphery portion of the casing 90 downward. Moreover, in FIG. 1, a connecting electrode 86 is provided to electrically connect the plasma processing part 80, the matching box 84 and the radio frequency power source 85 with each other.

Figure 6:
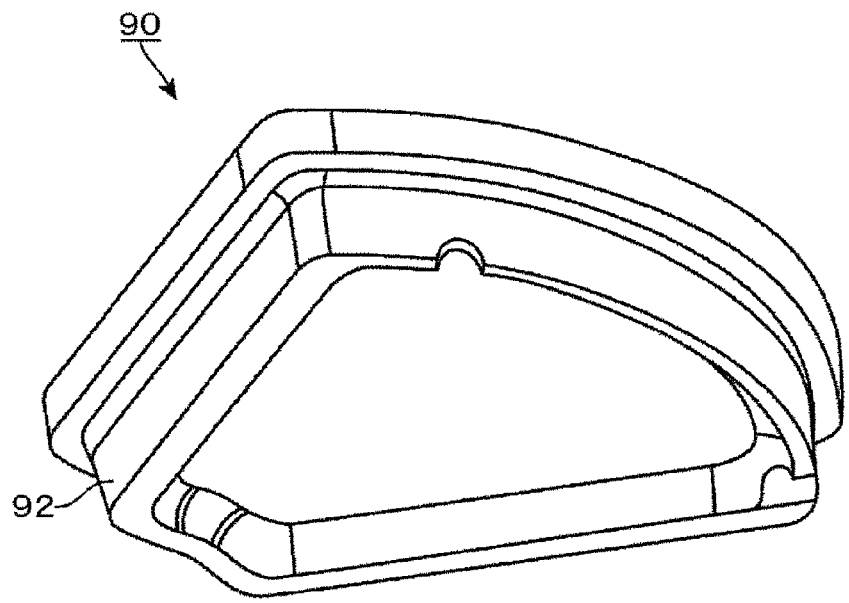
FIG. 6 is a perspective view illustrating a casing housing a plasma treatment part and a heat lamp of the film deposition apparatus.

As shown in FIGS. 1 and 6, a peripheral portion of the lower surface of the casing 90 perpendicularly extends downward (toward the turntable 2) throughout the circumference and forms a protruding portion 92 for gas restriction to prevent a nitrogen gas and an ozone gas from entering an area under the casing 90. The plasma generating gas nozzle 34 is housed in the area surrounded by an inner periphery of the protruding portion 92, the lower surface of the casing 90 and the upper surface of the turntable 2.

As shown in FIGS. 1, 4 and 5, a tray-shaped Faraday shield 95 whose upper surface is open is arranged between the casing 90 and the antenna 83. This Faraday shield 95 is made of a metal plate having a conductive plate-like body, and is grounded. Slits 97 are formed in a bottom surface of the Faraday shield 95 to prevent an electric field component of an electric field and a magnetic field (an electromagnetic field) generated by the antenna 83 from going toward the lower wafer W and to pass through the magnetic field to the wafer W. The slits 97 are individually formed to extend in a direction perpendicular to the winding direction of the antenna 83, and arranged throughout the circumferential direction along the antenna 83 at intervals under the antenna 83. An insulating plate 94 made of, for example, quartz is provided between the Faraday shield 95 and the antenna 83 to obtain insulation therebetween. In FIG. 4, depiction of the slit 97 is omitted.

Figure 8:
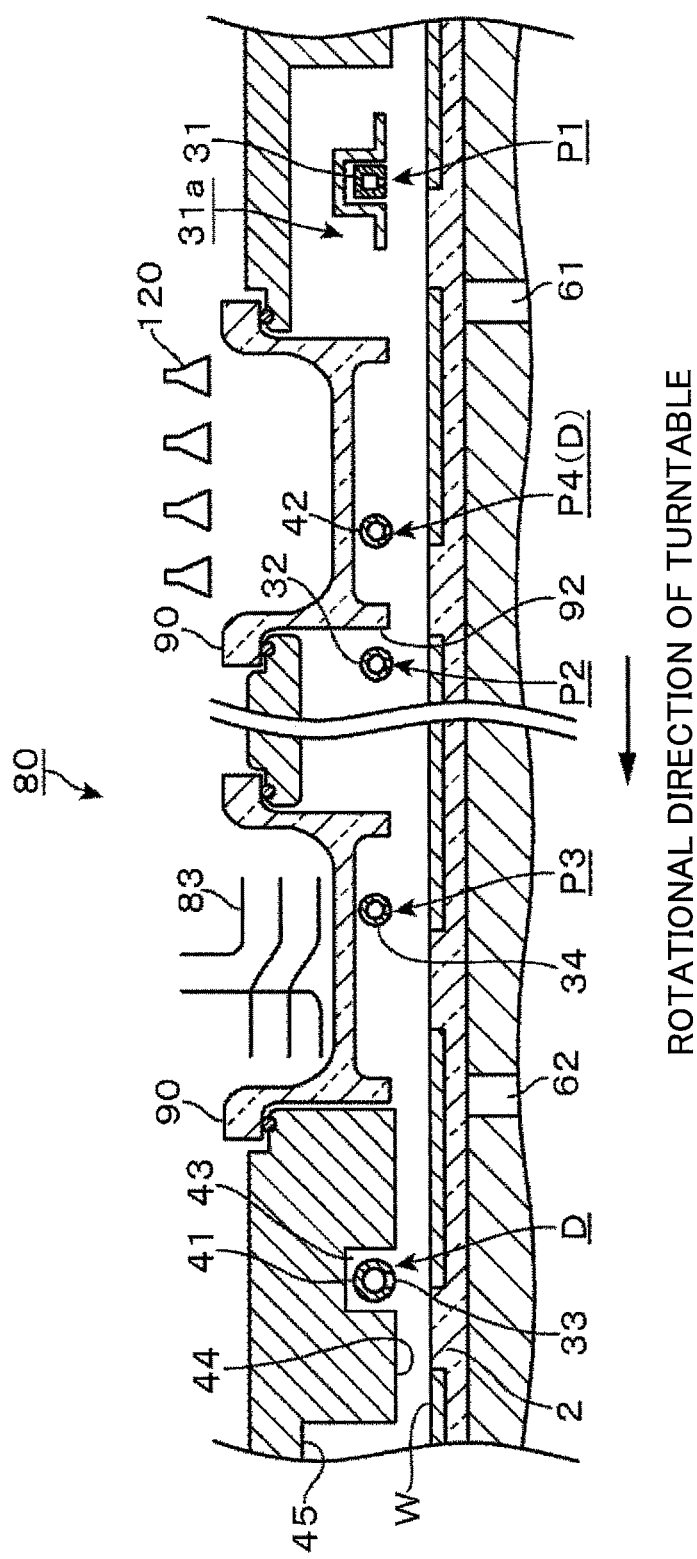
FIG. 8 is a vertical cross-sectional view schematically illustrating an appearance when cutting the film deposition apparatus.

The separation gas nozzles 41 and 42 are respectively provided to form separation areas D for separating the first process area 21 and the second process area P2 from each other. As illustrated in FIGS. 3 and 4, approximately sectorial convex portions 4 are provided on the ceiling plate 11 of the vacuum chamber 1 in the separation areas D, and the separation gas nozzles 41 and 42 are housed in the convex portions 4. Accordingly, as illustrated in FIG. 8, on both sides in the circumferential direction of the turntable 2 of the separation gas nozzles 41 and 42, low ceiling surfaces 44 that are the lower surfaces of the convex portions 4 are arranged to prevent the respective process gases from being mixed with each other, and higher ceiling surfaces 45 higher than the low ceiling surfaces are arranged on both sides in the circumferential direction of the low ceiling surfaces 44. The outer edge portions of the convex portions 4 (i.e., regions of the outer edge side of the vacuum chamber 1) are perpendicularly folded downward so as to face the outer edge surface of the turntable 2 and to be slightly apart from the chamber body 12 in order to prevent the respective process gases from being mixed with each other. In FIG. 8, the plasma treatment part 80 is drawn by being simplified.

Next, a description is given below of the separation gas nozzle 42. Above the separation gas nozzle 42, the casing 90 described in the plasma treatment part 80 is provided. More specifically, the ceiling plate 11 on the upper side of the separation gas nozzle 42 is open in an approximately sectorial form when seen from a planar perspective, and is hermetically closed by the casing 90. In addition, with respect to the casing 90, an outer edge portion in the lower surface extends vertically toward the turntable 2 throughout the circumferential direction, and forms the protruding portion 92. Accordingly, when seen from the separation gas nozzle 42, the protrusion portion 92 is each arranged on the upstream side and the downstream side of the turntable 2 in the rotational direction, on the center area C side, and the outer edge side of the turntable 2. Because of this, when the separation gas 42 discharges the separation gas, the area under the casing 90 has a higher pressure than the other areas in the vacuum chamber 1, which prevents the first process gas from entering from the upstream side in the rotational direction of the turntable 2 and the second process gas from entering from the downstream side in the rotational direction of the turntable 2.

Above the casing 90 seen from the separation gas nozzle 42, the heat lamp 120 for performing a modification (heat annealing) treatment for the wafer W is provided as a heating mechanism. This heat lamp 120 irradiates the wafer with light of a wavelength that transmits members made of quartz (i.e., the casing 90 and the turntable 2) and the wafer W absorbs (e.g., 0.5 μm to 3 μm) to heat the wafer W up to an annealing temperature higher than the above-mention film deposition temperature such as 650 degrees Celsius to 900 degrees Celsius, and is provided at a plurality of locations. In other words, because the wafer W rotates on the turntable 2 and the circumferential speeds of the wafer W differ on the rotational center side and the outer edge side, the arranged number and the layout of the heat lamps 120 are adjusted to make the heating temperature of the wafer W in the radial direction of the turntable 2. More specifically, the heat lamps 120 are arranged in an arc form along the rotational direction of the turntable 2 at plurality of locations, and the plurality of arc-shaped arrays, five arrays in this example, are arranged so as to be away from each other in a radial direction of the turntable 2 and in a concentric fashion.

Here, when the arc-shaped arrays are called "lamp groups", and each of the lamp groups are expressed as the lamp groups 121, 122, 123, 124 and 125 by attaching the numerals to the lamp groups from the rotational center side to the outer peripheral side of the turntable 2, each of the heat lamps 120 in the lamp groups 121 to 125 are arranged to increase the number from the rotational center side to the outer peripheral side of the turntable 2. Specifically, the lamp groups 121 to 125 respectively include two, three, four, five and six heat lamps 120. Moreover, the lamp group 121 on the rotational center side of the turntable 2 is arranged to be located above the outer edge on the rotational center side in the wafer W on the turntable 2. The lamp group 125 on the outer edge side of the turntable 2 is arranged to be located above the outer edge on the edge side in the wafer W on the turntable 2. Furthermore, the lamp groups 122 to 124 are arranged at equal intervals from each other between the lamp group 121 on the rotational center side and the lamp group 125 on the outer edge side.

Figure 7:
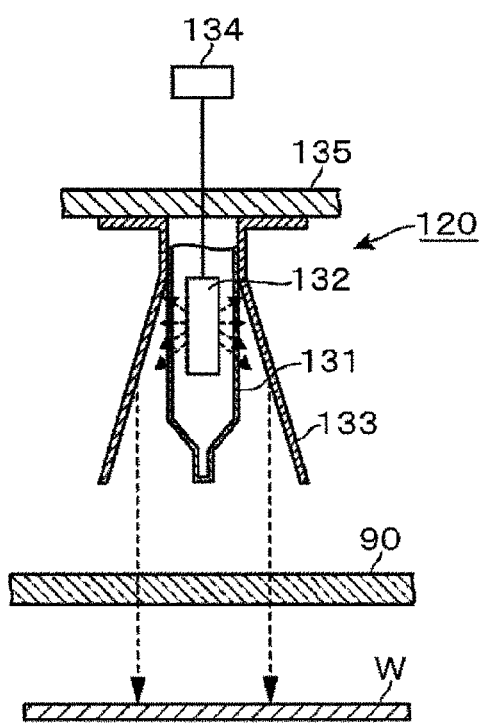
FIG. 7 is a vertical cross-sectional view illustrating the heat lamp.

A simple description is given below of each of the heat lamps 120. As illustrated in FIG. 7, these heat lamps 120 are each configured as a halogen lamp by encapsulating a light source 132 forming a radiant source within a light transmissive member 131 such as glass that vertically extends having an approximately cylindrical shape. In addition, in order to reflect the infrared light emitted from the light source 132 to the upper side and the lateral side, a reflective member 133 whose lower side is open and having an approximately cylindrical shape is provided so as to cover the upper side and the lateral side of the light transmissive member 131. Accordingly, the infrared light emitted from the light source 132 as radiant heat is concentrated downward and absorbed by the wafer W on the turntable 2 after transmitting through the light transmissive member 131 and the casing 90. Moreover, because the turntable 2 is made of quartz as described above, the heat lamps 120 locally heats only the wafer W by the radiant heat. Thus, an area under the separation gas nozzle 42 forms a heating area P4 to perform annealing treatment for the wafer W on the turntable 2 as well as forms the separation area D as described above.

In FIG. 7, a power supply part 134 is provided to supply electricity to each of the heat lamps 120, and, for example, is configured to be able to adjust a supply amount to each of the lamp groups 121 to 125 individually in a range equal to or less than 300 W in order to heat the wafer W up to a uniform temperature throughout the surface of the wafer W. Moreover, in FIG. 7, a boxy storing member 135 whose lower surface side is open supports the upper end of each of the heat lamps 120 therein, and makes an emission location of the infrared light of each of the heat lamps 120 uniform. Here, in FIG. 1, a vertical cross-sectional view is illustrated with respect to a part of the reflective member 133, and in FIG. 5, the heat lamps 120 and the casing 90 under the heat lamps 120 are omitted.

Figure 9:
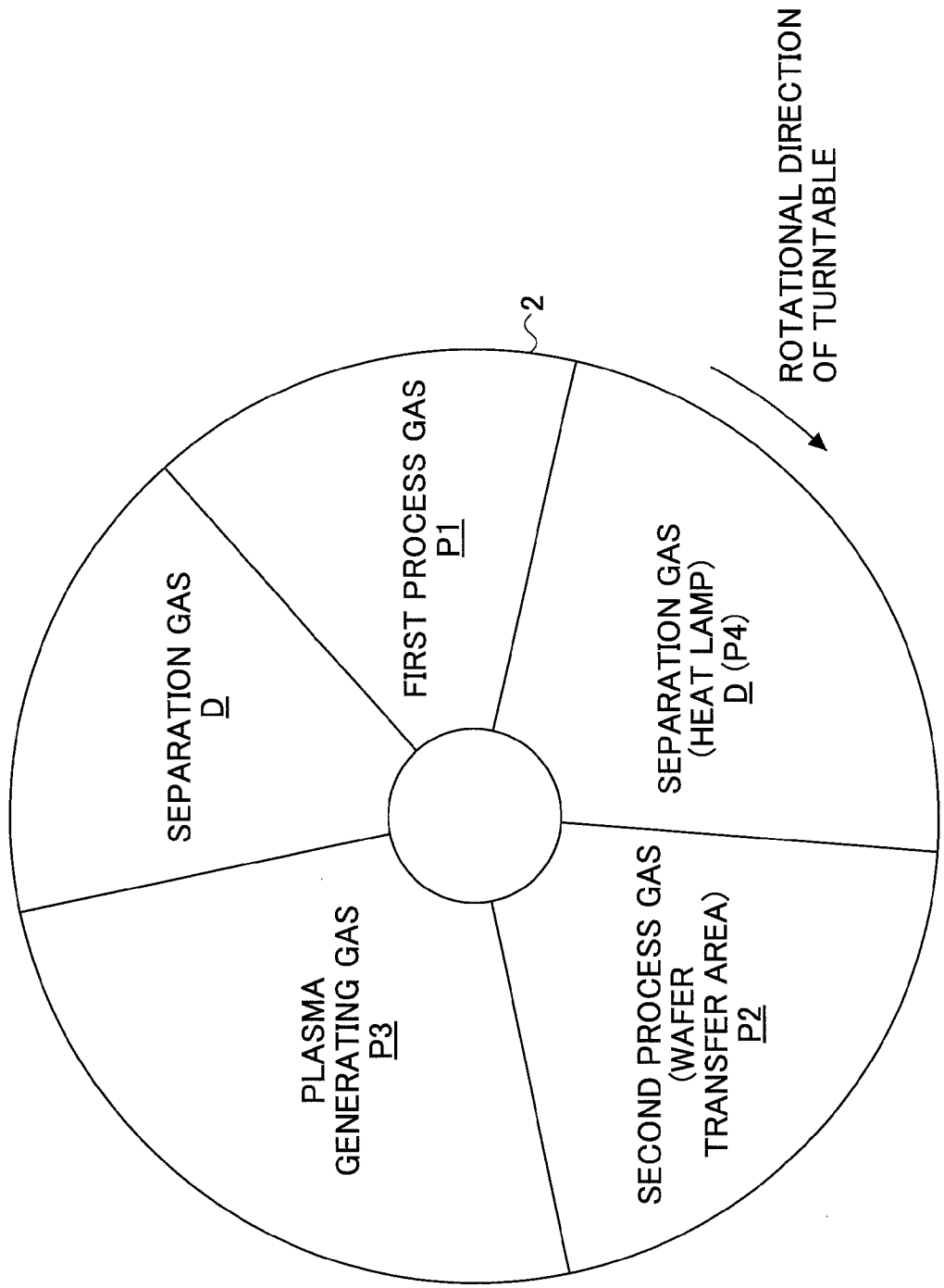
FIG. 9 is a schematic view illustrating a distribution of each gas supplied into a vacuum chamber of the film deposition apparatus.

FIG. 9 schematically illustrates areas where each of the gases described above are supplied, and each of the separation areas D are provided between the first process area P1 where the first process gas is supplied and the second process area P2 where the second process gas is supplied. Furthermore, a modification area P3 is located between the separation area D on the downstream side of the second process area P2 and the second process area P2, and another separation area D arranged away from the separation area D in the circumferential direction forms the heating area P4 as described above.

A ring-shaped side ring 100 is arranged at a position slightly lower than the turntable 2 and outer edge side of the turntable 2, and evacuation openings 61 and 62 are formed in an upper surface of the side ring 100 at two locations so as to be distant in the circumferential direction from each other. In other words, two evacuation ports are formed in the bottom portion 14 of the vacuum chamber 1, and the evacuation openings 61 and 62 are formed at the positions corresponding to the two evacuation ports. When one is called a first evacuation opening 61 and the other is called a second evacuation opening 62 of the two evacuation openings 61 and 62, the first evacuation opening 61 is formed at a position closer to the separation area D between the first process gas nozzle 31 and the separation area D on the downstream side of the first process gas nozzle 31 in the rotational direction of the turntable 2. The second evacuation opening 62 is formed at a position closer to the separation area D between the plasma generating gas nozzle 34 and the separation area D on the downstream side of the plasma generating gas nozzle 34 in the rotational direction of the turntable 2.

The first evacuation opening 61 is to evacuate the first process gas and the separation gas. The second evacuation opening 62 is to evacuate the plasma generating gas in addition to the second process gas and the separation gas. A groove-like gas flow passage 101 is formed in the upper surface of the of the side ring 100 on the outer edge side of the casing 90 to circulate the gas to the second evacuation opening 62 while avoiding the casing 90. The first evacuation opening 61 and the second evacuation opening 62 are, as shown in FIG. 1, respectively connected to evacuation mechanisms such as vacuum pumps 64 through evacuation pipes 63 including pressure controllers 65 such as butterfly valves.

As shown in FIG. 3 and the like, in the center portion on the lower surface of the ceiling plate 11, a protrusion portion 5 is provided that is continuously formed into an approximate ring shape from the portion on the center area C side of the convex portions 4 and whose lower surface is formed into the same height as the lower surface of the convex portions 4. As shown in FIG. 1, above the core portion 21 closer to the rotational center side of the turntable than the protrusion portion 5, a labyrinth structure 110 is arranged to suppress the first process gas and the second process gas from being mixed with each other in the center area C. The labyrinth structure 110 adopts a structure that includes a first wall portion 111 vertically extending from the turntable 2 side toward ceiling plate 11 side throughout the circumferential direction and a second wall portion 112 vertically extending from the ceiling plate 11 side toward the turntable 2 side throughout the circumferential direction that are formed alternately in the radial direction of the turntable 2.

As shown in FIGS. 2 through 4, a transfer opening 15 is provided in the side wall of the vacuum chamber 1 to transfer the wafer W between a transfer arm that is not shown in the drawings but provided outside the vacuum chamber 1 and the turntable 2. The transfer opening 15 is configured to be hermetically openable and closable by a gate valve G. In addition, because the wafer W is transferred into or from the concave portions 24 at a position facing the transfer opening 15 with the transfer arm, lift pins for transfer to lift up the wafer W from the back side by penetrating through through-holes formed in the concave portion 24 and the lifting mechanism (none of which are shown in the drawing) are provided at the position corresponding to the transfer position under the turntable 2.

Moreover, a control part 200 constituted of a computer to control operation of the whole apparatus is provided in this film deposition apparatus, and a program to implement the film deposition process and the modification treatment that are described below is stored in a memory of the control part 200. This program is constituted of instructions of step groups to cause the apparatus to implement operations described below, and is installed from a memory unit 201 to be a storage medium such as a hard disk, a compact disc, a magnetic optical disc, a memory card and a flexible disc into the control part 200.

Figure 10:
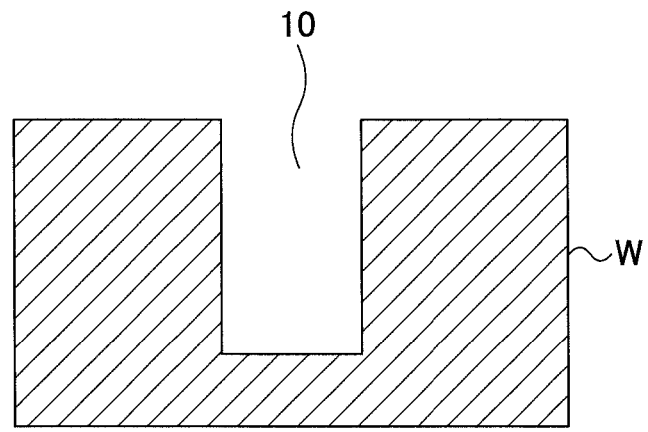
FIG. 10 is a first schematic view illustrating an action in the film deposition apparatus.
Figure 13:
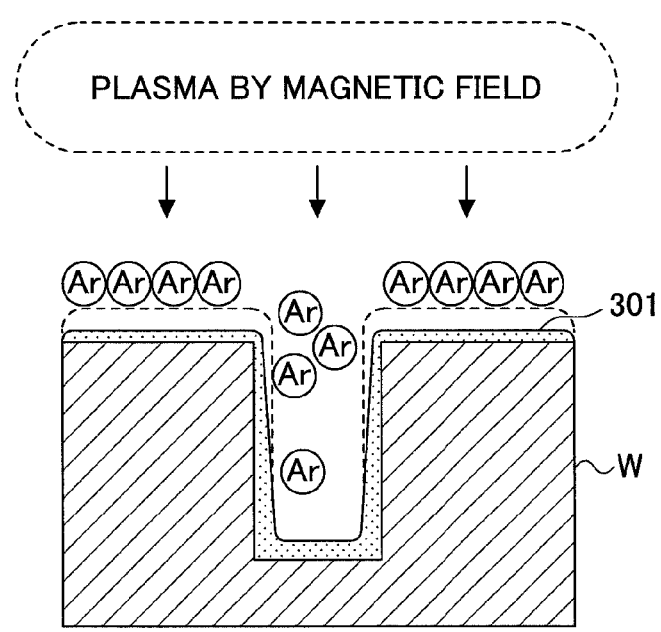
FIG. 13 is a fourth schematic view illustrating an action in the film deposition apparatus.
Figure 14:
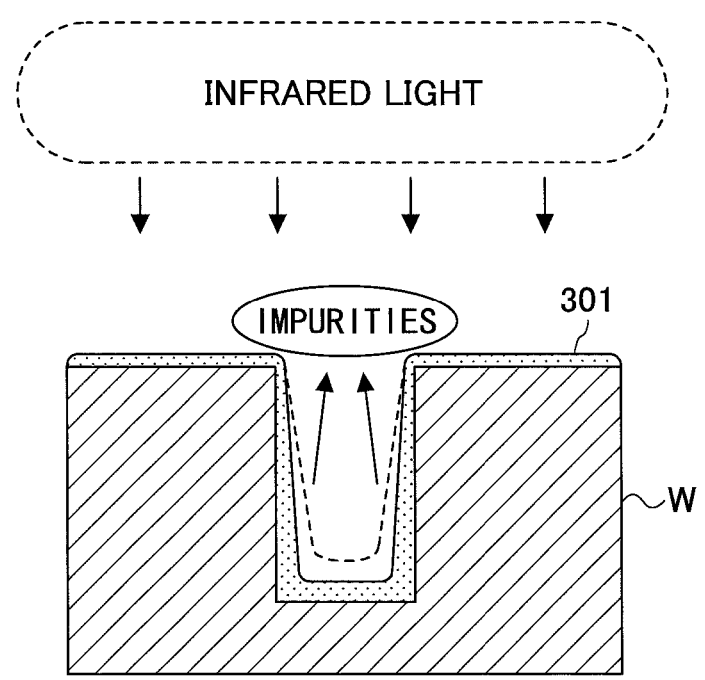
FIG. 14 is a fifth schematic view illustrating an action in the film deposition apparatus.
Figure 15:
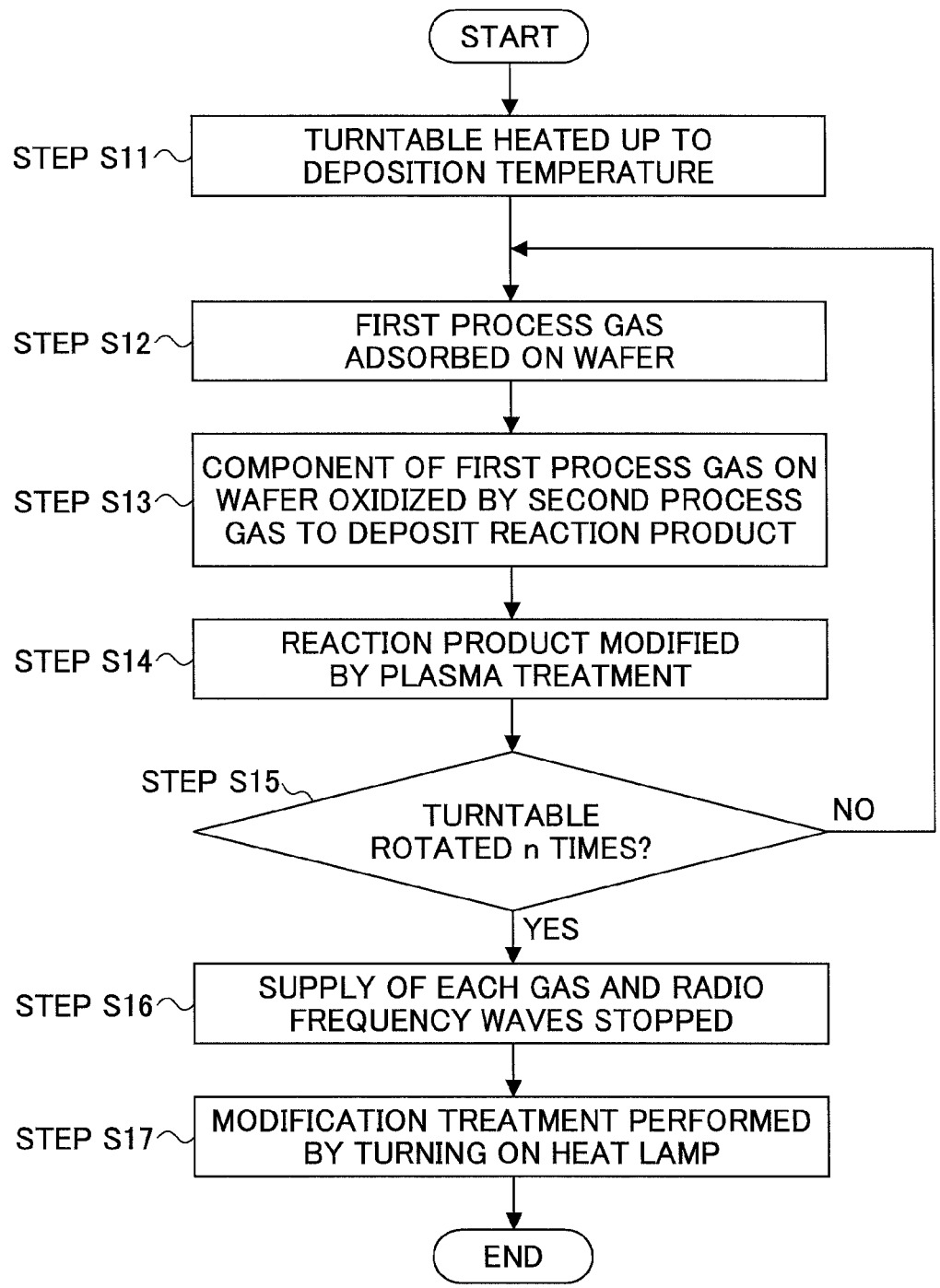
FIG. 15 is a flow diagram illustrating a flow of the actions.

Next, a description is given of operation in the embodiment, with reference to FIGS. 10 through 14 and a flowchart in FIG. 15. To begin with, the gate valve G is opened, and while rotating the turntable 2 intermittently, for example, five wafers W are placed on the turntable 2 through the transfer opening 15 by the transfer arm not shown in the drawings. As shown in FIG. 10, a concave portion 10 including a groove, a hole and the like is formed in a surface of each of the wafers W, and an aspect ratio of the concave portion 10 (i.e., a depth dimension of the concave portion 10/a width dimension of the concave portion 10) is, for example, from dozens to over one hundred (less than two hundred). Next, the gate valve G is closed, and the turntable 2 is rotated at, for example, 2 to 240 rpm in a clockwise fashion while the inside of the vacuum chamber 11 is continuously evacuated by the vacuum pump 64. Then the wafer W is heated by the heater unit 7, for example, up to about 300 degrees Celsius (step S11).

Subsequently, the process gas nozzles 31, 33 respectively discharge a first process gas and a second process gas, and the plasma generating gas nozzle 34 discharges a plasma generating gas. Furthermore, the separation gas nozzles 41 and 42 discharge a separation gas at a predetermined flow rate, and the separation gas supply pipe 51 and the purge gas supply pipe 72 and 73 discharge a nitrogen gas at predetermined flow rates. Then, the pressure controller 65 adjusts a pressure in the vacuum chamber 11 at a preliminarily set processing pressure.

Figure 11:
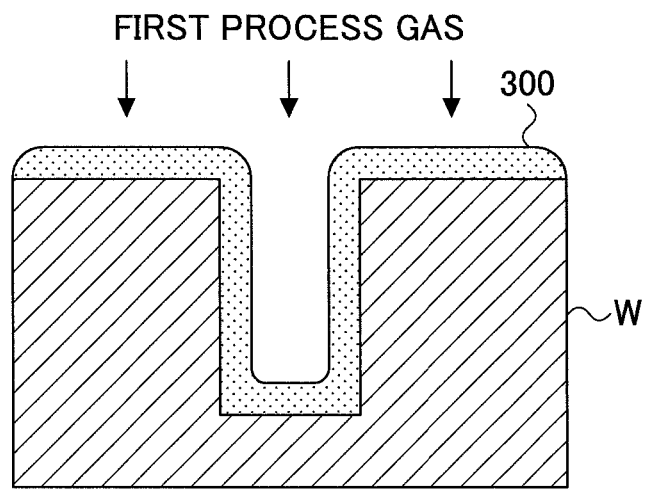
FIG. 11 is a second schematic view illustrating an action in the film deposition apparatus.
Figure 12:
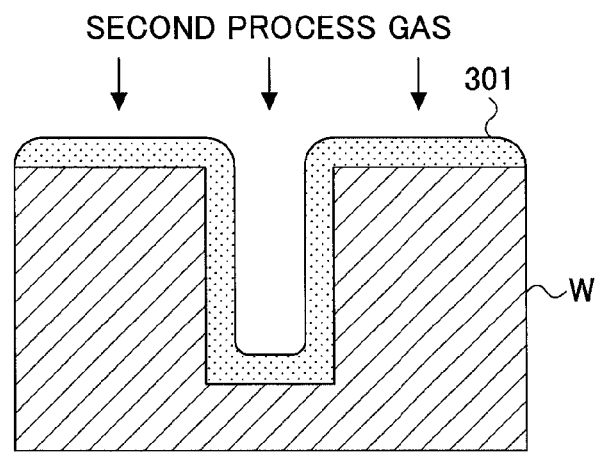
FIG. 12 is a third schematic view illustrating an action in the film deposition apparatus.

As shown in FIG. 11, in the first process area P1, a component of the first process gas is adsorbed on the surface of the wafer W and an adsorbed layer 300 is deposited (step S12). Next, as shown in FIG. 12, in the second process area P2, the adsorbed layer 300 is oxidized, and one or a plurality of layers of a molecular layer of silicon oxide film ($SiO_2$) of a thin film component is deposited, by which a reaction layer 301 of a reaction product is formed (step S13). Sometimes impurities such as water (i.e., OH group) or an organic substance may remain in the reaction layer 301 due to, for example, a residual group contained in the first process gas.

As schematically shown in FIG. 13, an electric field and a magnetic field are generated in the plasma treatment part 80 by the radio frequency power supplied from the radio frequency power source 85. The electric field of the electric field and the magnetic field is reflected or absorbed (damped) by the Faraday shield 95, and is prevented from entering the vacuum chamber 1. On the other hand, because the slits 97 are formed in the Faraday shield 95, the magnetic field reaches the modification area P3 in the vacuum chamber 1 by passing through the slits 97 and the bottom of the casing 90.

Accordingly, the plasma generating gas discharged from the plasma generating gas nozzle 34 is activated by the magnetic field, and plasma such as ions (e.g., argon ions: $Ar^+$) or radicals is generated. As discussed above, because the antenna 83 is arranged to surround the zonal area extending in the radial direction of the turntable 2, this plasma is formed into an approximate linear shape so as to extend in the radial direction under the antenna 83. When the wafer W contacts the plasma, the modification treatment of the reaction layer 301 is carried out (step S14). More specifically, by allowing the plasma to collide with the surface of the wafer W, impurities such as water, an organic substance or the like are released, or densification (density growth) of the reaction layer 301 is caused by occurrence of rearrangement of elements in the reaction layer.

Thus, when the above-described film deposition process of the adsorbed layer 300, formation process of the reaction layer 301 by oxidizing the adsorbed layer 300, and plasma modification treatment of the reaction layer 301 are repeated multiple times (n times, n: a natural number), n reaction layers 301 are deposited and a thin film is formed. More specifically, the above-mentioned control part 200 determines whether the turntable 2 has already rotated n times, in other words, whether the number of deposited layer of the reaction layer 301 has reached the n layers, after performing the formation of the adsorbed layer 300, the formation of the reaction layer 301 and the plasma modification treatment (step S15). When the reaction layer 301 does not reach the n layers, the rotation of the turntable 2, the supply of the respective gases and the supply of electricity to the radio frequency power 85 are continued.

Here, because the concave portion 10 having an extremely large aspect ratio is formed in the surface of the wafer Was discussed above, the plasma is unlikely to go into the concave portion 10. In addition, because the film deposition process is carried out together with the plasma modification treatment in the vacuum chamber 1, the process pressure in the vacuum chamber 1 is higher than a pressure easy to keep the plasma preferably active. Due to this, when the plasma intrude toward the bottom surface of the concave portion 10, if, for example, the plasma contact with the inner wall surface of the concave portion 10, the plasma becomes deactivated. Accordingly, as shown in FIG. 13, because a degree of the plasma modification treatment decreases as the distance to the bottom surface in the concave portion decreases, a film thickness grade increasing from the upper side to the lower side is formed. In other words, while a dense thin film is deposited on the surface of the wafer W (i.e., a horizontal surface between the concave portions 10 adjacent to each other) by allowing the plasma modification treatment to be preferably performed, a thin film whose density decreases as the distance to the bottom surface of the concave portion 10 decreases is deposited. Therefore, in order to deposit a dense thin film throughout the depth direction of the concave portion 10, when it is determined that the n reaction layers 301 are deposited and the deposition of the thin film is completed in the above-mentioned step S15, a modification treatment by annealing treatment is performed described below.

More specifically, supplying the respective gases (the first process gas, the second process gas, the plasma generating gas and separation gas) is stopped, and supplying electricity to the radio frequency power 85 is stopped (step S16). After finishing evacuation of each of the gases from the inside of the vacuum chamber 1, that is to say, after decreasing the pressure inside the vacuum chamber 1 up to, for example, 133 to 1333 Pa (1 to 10 Torr), the power supply part 134 supplies electricity to each of the heat lamps 120 (i.e., the heat lamps 120 are turned on), by which these heat lamps 120 emit the infrared light downward. The infrared light transmits through the casing 90 and the turntable 2 as described above, but is absorbed by the wafer W. Because of this, each of the wafers W rotating by the turntable 2 is locally and rapidly heated up to the above-mentioned annealing temperature. Accordingly, the other members in the vacuum chamber 1 such as the turntable 2 are prevented from being heated.

Thus, when each of the wafers W is, for example, heated for 5 to 120 seconds while the turntable 2 is rotating, because each of the wafers W becomes the above-mentioned annealing temperature throughout a thickness direction of the wafers W, as illustrated in FIG. 14, the above-mentioned impurities such as water remaining in the thin film in the concave portion 10 are removed from the thin film, and a homogeneous and dense thin film throughout the depth direction of the concave portion 10 can be obtained (step S17). Accordingly, the film thickness of the thin film becomes also uniform throughout the depth direction of the concave portion 10. While performing the annealing treatment, because the turntable 2 contacts the wafers W, the turntable 2 increases its temperature by the heat entering from the wafers W. However, because the turntable 2 is made of quartz that is transparent to the infrared light, and further because the annealing treatment finishes for a short time period as described above, the rising temperature amount of the turntable 2 is very small. Here, in FIGS. 11 through 14 described above, a size of the concave portion 10 and a size of each of the films (i.e., adsorbed layer 300, reaction layer 301) are schematically depicted.

While performing a series of processes, due to the gas flow passage 101 formed in the side ring 100 provided at the outer edge side of the casing 90, each gas is evacuated through the gas flow passage 101 so as to flow away from the casing 90. Moreover, the protruding portion 92 provided on the lower end side of the periphery portion of the casing 90 prevents the nitrogen gas or the ozone gas from entering the casing 90.

Furthermore, because the nitrogen gas is supplied to the separation area D between the first process area P1 and the second process area P2, the first process gas, the second process gas and the plasma generating gas are evacuated without being mixed with each other. In addition, since a purge gas is supplied to an area under the turntable 2, the gas likely to diffuse the area under the turntable 2 is pushed back toward the evacuation openings 61 and 62 by the purge gas.

According to the above embodiment, after depositing a thin film by repeating a step of depositing a reaction layer 301 while rotating the turntable 2, and a step of modifying the reaction layer 301 by plasma, supply of each of respective gases is stopped, and the thin film is modified by heating the wafer W at a temperature higher than the temperature during the thin film deposition. Due to this, even if the concave portion 10 of a large aspect ratio is formed in the surface of the wafer W as described above, a homogeneous and dense (i.e, high-quality) thin film throughout the depth direction of the concave portion can be deposited.

Here, a detailed description is given below of reasons why the annealing treatment is performed with the plasma modification treatment by a sequence described above. As shown in experimental examples described below, for example, when a thin film made of a silicon oxide film is just deposited by using the ALD method at a film deposition temperature of 300 degrees Celsius or 650 degrees Celsius, an etching rate of the thin film in hydrofluoric acid (hydrogen fluoride solution) is higher than that of a thermal oxide film (i.e., an oxide film obtained by oxidation treatment of heating a silicon substrate). Accordingly, the silicon oxide film deposited by the ALD method can be said to have a film density lower than that of the thermal oxide film. The plasma modification treatment is known as art of improving a film density of such a thin film, as described in the background of the invention. By modifying the reaction layer 301 each time the reaction layer 301 is deposited, that is to say, by arranging the plasma treatment part 80 at a location away from each process areas P1, P2, even a thin film deposited at a low temperature can have a preferable film density as described above. However, when the concave portion 10 is formed in the surface of the wafer W, the film density varies in the depth direction of the concave portion 10 because the plasma is unlikely to reach the vicinity of the bottom surface of the concave portion 10.

On the other hand, the annealing treatment that is a method of heating a wafer W at a temperature higher than the film deposition temperature is known as art of improving a film density of a thin film as well as the plasma modification treatment. According to the annealing treatment, because the wafer W can be heated throughout the thickness direction of the wafer W, the heat treatment can be performed uniformly throughout the depth direction even if the concave portion is formed as described above. However, as shown in the working examples described below, a sufficient film density cannot be obtained by only the annealing treatment.

Therefore, in the embodiment of the present invention, as already described in detail, the plasma treatment is performed each time the turntable 2 rotates, and the annealing treatment is performed after depositing multiple layers of the reaction layer 301 and forming a thin film. In other words, a method is adopted where the annealing treatment is performed together after depositing a thin film while the plasma treatment is performed each time the reaction layer 301 is deposited. Accordingly, in carrying out the annealing treatment in combination with the plasma treatment, the method of the embodiment of the present invention is a highly effective method in terms of a film quality of an obtained thin film, a heat resistance structure of the apparatus, and even a throughput. More specifically, as noted from the working examples described below, a thin film having a sufficiently high film quality can be obtained only by performing the annealing treatment as a whole after depositing the thin film even if the annealing treatment is not performed each time the reaction layer 301 is deposited. Due to this, the heat lamps 120 do not need to be fed constantly, which provides an advantage in terms of cost.

Moreover, with respect to the heat resistance structure of the apparatus, because the annealing treatment is performed as a whole after depositing the thin film, and the wafer W is locally heated by the heat lamps 120, a time period required for the annealing treatment (i.e., a time period for supplying electricity to the heat lamps 120) needs only a short time period of a degree of several tens of seconds. Hence, in such a brief annealing treatment, members in the vacuum chamber 1 such as the turntable 2 hardly rise in temperature. Accordingly, the seal structure between the vacuum chamber 1 and the ceiling plate 11 or the casing 90, and the heat resistance structure in a region where the turntable 2 is fixed to the core part 21, need only a heat resistance structure that can resist the film deposition temperature to perform the film deposition process (e.g., 300 degrees Celsius to 650 degrees Celsius). That is to say, even if the apparatus does not have a heat resistance structure that can resist the annealing temperature, in other words, even if the apparatus cannot resist the annealing temperature, the annealing treatment at a high temperature of the annealing temperature can be performed.

Accordingly, from an apparatus manufacturer's perspective, between an apparatus that performs only a film deposition process and a plasma modification treatment, and an apparatus that performs an annealing treatment in addition to the film deposition process and the plasma modification treatment, components other than the heat lamps 120 and the ceiling plate 11 (casing 90) such as heating mechanism of the heater unit 7 can be shared. In other words, by configuring the apparatus that performs the film deposition process by using the ALD method and the plasma modification, the annealing treatment at high temperature can be performed only by providing the heat lamps 120 or the casing 90. Accordingly, general versatility is high, and the cost in manufacturing the apparatus can be reduced.

To give an example of application of a silicon oxide film deposited by using such an apparatus, when the silicon oxide film is deposited as a hard mask to etch a wafer W, a required level about density is not so high because the silicon oxide film is removed after the etching. Accordingly, in such a case, an apparatus without the heat lamps 120 is used. In contrast, when a silicon oxide film is deposited along an inner wall surface of a concave portion as a barrier film against a copper interconnection filled in the concave portion later, the silicon oxide film is required to be as dense as possible because the silicon oxide film remains after forming a device. Hence, in this case, an apparatus with the heat lamps 120 is used. In this manner, an applied apparatus is selected according to a device to which the silicon oxide film is applied, in other words, according to a required level about a density of the silicon oxide film.

In addition, by incorporating the heat lamps 120 into the single common vacuum chamber 1 in addition to the respective nozzles 31, 32, 41 and 42 and the plasma treatment part 80, the annealing treatment can be performed so-called "in situ." This renders the transfer of the wafer W to another heat treatment apparatus from the vacuum chamber 1 unnecessary, which can improve the throughput by the time period required for the transfer of the wafer W, compared to a case, for example, of performing the heat treatment at another heat treatment apparatus after performing the film deposition process and the plasma modification treatment.

Moreover, in performing the annealing treatment in the vacuum chamber 1, the heating temperature for the wafer W in the annealing treatment is 650 degrees Celsius to 900 degrees Celsius, which is higher than the temperature during the film deposition process as described above. Furthermore, the annealing temperature is higher than a thermal decomposition temperature of the BTBAS gas of the first process gas (e.g., 550 degrees Celsius) and a thermal decomposition temperature of the ozone of the second process gas (e.g., 600 degrees Celsius). In addition, even when the wafer W heated to the annealing temperature by the heat lamps 120 reaches the first process area P1 and the second process area P2 in the later stages, the wafer W does not decrease in temperature too much because the turntable 2 rotates at a high speed. Accordingly, if the annealing treatment is performed while supplying each of the gases, when each of the gases contacts the high-temperature wafer W, each of the gases thermally decomposes, and the adsorption of the first process gas and the oxidation of the adsorbed layer 300 cannot be performed preferably. Therefore, in the embodiment of the present invention, in performing the annealing treatment, the supply of each of the gases is stopped, and the annealing treatment is performed after and while the gases are evacuated from the vacuum chamber 1. Hence, the annealing treatment can be carried out preferably while preventing the thermal decomposition of each of the gases. Moreover, in order to obtain, for example, oxygen plasma as the second process gas that does not decompose in the annealing treatment, incidental facilities such as the radio frequency power source are required, but such incidental facilities and further electric power to drive the incidental facilities are not required by using the ozone gas as the second process gas.

In addition, the heat lamps 120 are arranged on or above the separation area D to separate the first process area P1 from the second process area P2, and the separation area D and the heating area P4 to perform the annealing treatment are provided in a shared manner. Because of this, the annealing treatment can be performed while suppressing enlargement of the film deposition apparatus even in the above-mentioned apparatus scarcely having an extra space in a manner that includes the plasma treatment part 80, the camera unit 10a, and the temperature detection part of the wafer W arranged in the circumferential direction on the ceiling plate 11, and each of the gas nozzles 31, 32, 34, 41 and 42 is arranged in the circumferential direction in the vacuum chamber 1.

The heat lamps 120 may be provided above the separation gas nozzle 41.

Figure 16:
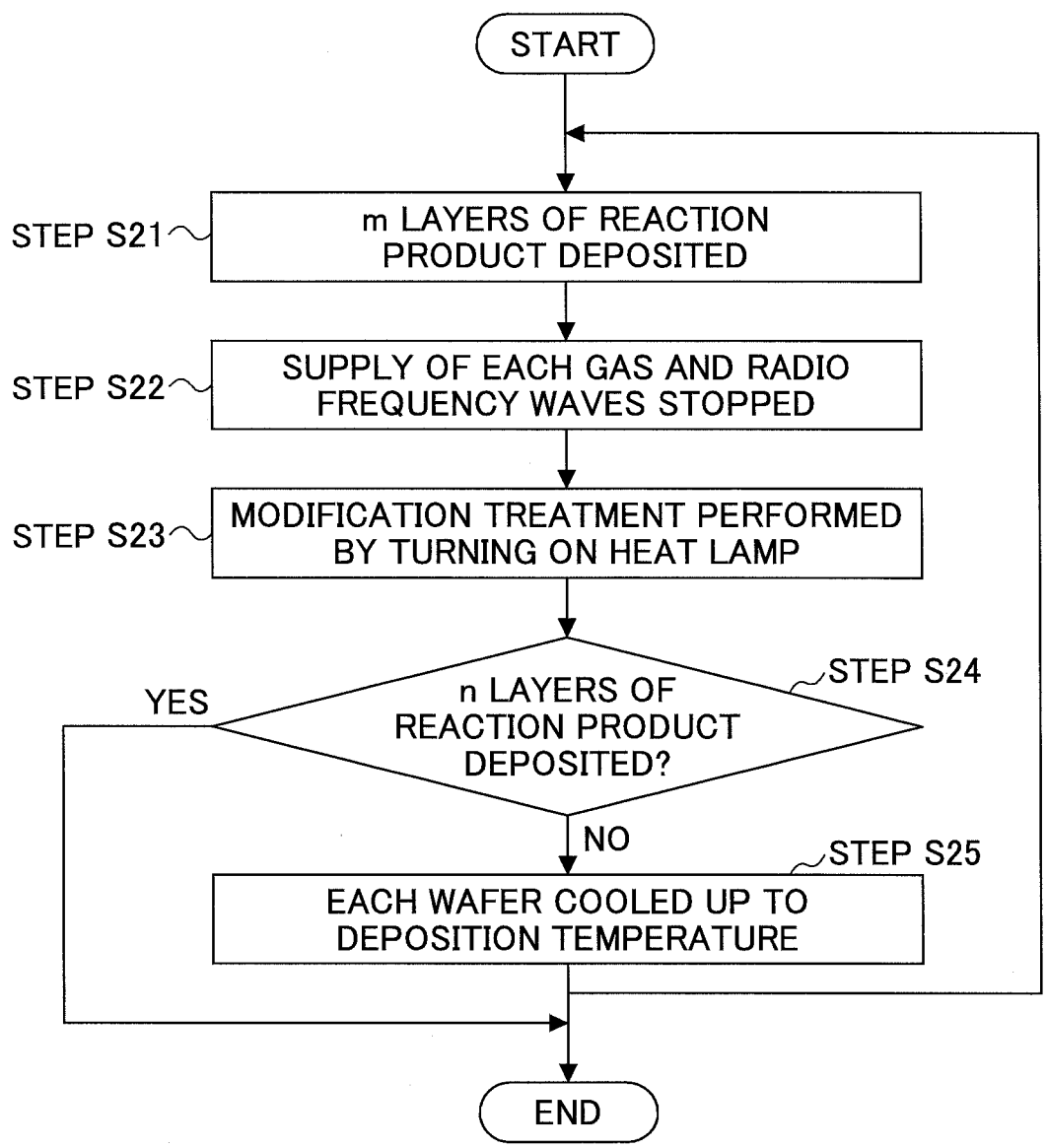
FIG. 16 is a schematic view illustrating a sequence in another example of the film deposition apparatus.

In the above examples, the annealing treatment is performed after forming the thin film by depositing the n reaction layers 301, but the annealing treatment may be performed in the middle of depositing the thin film in addition to the annealing treatment after forming the thin film. More specifically, as illustrated in FIG. 16, after forming m reaction layers 301 (m: a natural number less than n and equal to or more than one) and performing the plasma modification treatment similarly to the above-mentioned examples (step S 21), supplying each of the gases and supplying electricity to the radio frequency power source 85 are stopped (step S22). Next, the annealing treatment of the m reaction layers 301 is performed by using the heat lamps 120 (step S23). Subsequently, when the number of deposited layers of the reaction layers 301 does not reach the n layers (step S24), the wafer W is cooled up to the film deposition temperature set by the heater unit 7, for example, by supplying the separation gas into the vacuum chamber 1, while stopping the supply of the first process gas, the second process gas and the plasma generating gas (step S25). Then, after depositing m reaction layers 301 while performing the plasma modification treatment, supplying each of the gases is stopped, and the annealing treatment is performed similarly. Thus, by repeating the deposition of the reaction layers 301, the annealing treatment and the cooling of the wafer W, n reaction layers 301 are deposited similarly to the above-mentioned examples. Such a sequence can obtain effects similar to the above-mentioned examples. In FIG. 16, in repeating a sequence from step S21 to step S23 plurality of times, the number of deposited layers m in step S21 may take different values between a certain sequence and another sequence. In addition, the number of deposited layers m may be one, and in other words, the annealing treatment may be performed each time the reaction layer 301 is deposited. Here, step S21 in FIG. 16 corresponds to steps S11 to S15 in the above-mentioned FIG. 15.

In each of the above examples, a time period to perform the annealing treatment (a time period to supply electricity to the heat lamps 120) is preferably 5 to 120 seconds because the heat treatment of the wafer W is insufficient when the time period is too short, and the turntable 2 rises too highly in temperature, which is likely to cause damage to the heat resistance structure of the film deposition apparatus when the time period is too long. Moreover, a degree of vacuum in the vacuum chamber 1 at the time of performing the annealing treatment, when the vacuum chamber 1 is evacuated while stopping the supply of each of the gases in supplying electricity to the heat lamps 120, is preferably set at a degree of 133 to 1333 Pa (1 to 10 Torr) because the process gas is likely to remain in the vacuum chamber 1 when the degree of vacuum in the vacuum chamber 1 is too high at the time of performing the annealing treatment, and in contrast, the throughput decreases when the degree of vacuum in the vacuum chamber 1 is too low. Here, before performing the annealing treatment, an atmosphere in the vacuum chamber 1 is adjusted by evacuating the vacuum chamber 1 and by supplying the separation gas into the vacuum chamber 1, and the annealing treatment is performed at a pressure higher than the above degree of vacuum.

Furthermore, the plasma modification treatment may be performed each time a plurality of, for example, 10-to-100 reaction layers 301 is deposited. More specifically, supplying electricity to the radio frequency power source 85 is stopped at the start of the film deposition process, and after the turntable 2 is rotated predetermined number of times, which is equal to the number of reaction layers 301 to be deposited, supplying gases to the nozzles 31 and 32 is stopped while the plasma modification is performed by supplying electricity to the radio frequency power source 85. After that, deposition of the reaction layers 301 and the plasma modification are repeated again. In addition, the embodiment of the present invention may be applied not only to the wafer W including the concave portion 10 formed in the surface thereof, but also to a wafer W including a flat surface without such a concave portion 10 formed thereof.

Moreover, in each of the above-mentioned examples, inductively coupled plasma (ICP) is generated by winding around the antenna 83 as the plasma treatment part 80, but generating capacitively coupled plasma (CCP) is also possible. In this case, a pair of electrodes 160 (which is not shown in the drawing) is arranged as parallel electrodes on the downstream side in the rotational direction of the turntable 2 relative to the plasma generating gas nozzle 34. The plasma generating gas is converted to the plasma between the pair of electrodes 160.

Furthermore, in the embodiment, the annealing treatment is performed in the vacuum chamber 1 in addition to the film deposition process and the plasma modification treatment, but the annealing treatment may be performed in another heat treatment apparatus (or heating mechanism). More specifically, by using a vertical heat treatment apparatus including a wafer boat that maintains many, for example, about one hundred wafers W in a shelf form, and a reaction tube that hermetically houses the wafer boat from the lower side, the processed wafers W on which the film deposition process and the plasma modification treatment have been performed may be annealed together.

As for the first process gas used in depositing a silicon oxide film, compounds in TABLE 1 may be used. Here, in respective tables hereinafter, "Source A Area" shows the first process area P1, and "Source B Area" shows the second process area P2. In addition, the following respective gases are only examples, and already described gases are shown together.

TABLE 1

Source A Area
Insulating Layer Formation Material

DCS(Dichlorosilane), Tetraethoxysilane(TEOS),
Tetramethylsilane(TMS), HCD(Hexachlorodisilane),
Monosilane[$SiH_4$], Disilane[$Si_2H_6$], HMDS(Hexamethyldisilazane),
TCS(Trichlorosilane), DSA(Disilylamine), TSA(Trisilylamine),
BTBAS(Bis(tertiary-butyl-amino)silane),
3DMAS(Tris(dimethylamino)silane),
4DMAS(Tetrakis(dimethylamino)silane),
TEMASiH(Tris(ethylmethylamino)silane),
TEMASi(Tetrakis(ethylmethylamino)silane),
Si(MMP)$_4$(Tetrakis(1-methoxy-2-methyl-2-propoxy)silane)

When 3DMAS or 4DMAS is used as the first process gas, the thermal decomposition temperature of the first reaction gas is higher than the thermal decomposition temperature of the BTBAS, and is also higher than the annealing temperature.

Moreover, compounds in TABLE 2 may be used as a second process gas to oxidize the first process gas in TABLE 1.

TABLE 2

Source B Area
Oxidizing Source $O_2$(Oxygen), $O_3$(Ozone)
$H_2O$(Water)

TABLE 2-continued

| Source B Area |
| --- |
| Oxidizing Source |
| Plasma + $O_2$ |
| Plasma + $O_3$ |

Here, "Plasma+$O_2$" or "Plasma+$O_3$" in TABLE 2 means using the oxygen gas or the ozone gas by converting to the plasma, for example, by using the plasma treatment part 80 provided above the process gas nozzle 32, or the above-mentioned parallel electrodes. When the plasma of the oxygen gas is used as the second process gas, the thermal decomposition temperature of the second process gas is higher than the above-mentioned thermal decomposition temperature of the ozone, and is also equal to or more than the annealing temperature.

Furthermore, by using a compound in TABLE 1 as the first process gas, and by using a gas composed of a compound shown in TABLE 3 as the second process gas, a silicon nitride film (SiN film) may be deposited.

TABLE 3

| Source B Area |
| --- |
| Nitriding Source |
| $NH_3$(Ammonia) |
| $N_2$(Nitrogen) |
| Plasma + $NH_3$ |
| Plasma + $N_2$ |

Here, "Plasma" in TABLE 3 means using each of gases following the term of "Plasma" by converting to the plasma similarly to TABLE 2.

In addition, a silicon carbide (SiC) film may be deposited by using gases composed of a compound shown in TABLE 4 as the first process gas and the second process gas.

TABLE 4

| Source A Area Side SiC Film Formation Material (First Process Gas) | Source B Area Carbon Source (Second Process Gas) |
| --- | --- |
| $SiH_4$, $Si_2H_6$, Tetrachlorosilane($SiCl_4$), Trichlorosilane($SiHCl_3$), Dichlorosilane($SiH_2Cl_2$) | Propane($C_3H_8$), Ethylene($C_2H_4$), Acetylene($C_2H_2$), Ethane($C_2H_6$) |

Moreover, a silicon film (Si film) may be deposited by using the first process gas cited in TABLE 4. More specifically, the second process gas nozzle 32 is not provided in this case, and the wafer W on the turntable 2 alternately passes through the first process area (deposition area) and the modification area P3 by way of the separation areas D. Then the adsorbed layer 300 is deposited by allowing a component of the first process gas to be adsorbed on the surface of the wafer W in the first process area P1, while the turntable 2 rotates, the thermal decomposition is caused in the adsorbed layer 300 on the wafer W by the heat of the heater unit 7, and impurities such as hydrogen or chlorine are released. Accordingly, the reaction layer 301 is formed by the thermal decomposition reaction of the adsorbed layer 300.

However, because the turntable 2 rotates around the vertical axis, a time period after the wafer W on the turntable 2 has passed through the first process area and until the wafer W reaches the modification area P3, in other words, a time period for discharging the impurities, is very short. Because of this, the reaction layer 301 on the wafer W just before reaching the modification area P3 still contains the impurities. Therefore, by supplying the plasma of, for example, the argon gas, to the wafer W in the modification area P3, the impurities are removed from the reaction layer 301, and the reaction layer of a preferable film quality can be obtained. In this manner, by allowing the wafer W to pass through the area P1 and P3 alternately, the reaction layer 301 is deposited in a layer-by-layer manner, and a silicon film is deposited. Accordingly, in the embodiment of the present invention, the "plasma modification treatment" includes a treatment for reacting the adsorbed layer 300 (thermal decomposition treatment) in addition to a treatment for removing the impurities from the reaction layer 301 and for performing the modification of the reaction layer 301.

As for a plasma generating gas used for the plasma treatment of the silicon film, a gas that generates plasma that supplies energy of ions to the wafer W is available, and more specifically, an inactive gas such as helium (He) or a hydrogen gas other than the above-mentioned argon gas is used.

Furthermore, when depositing the silicon film, boron (B) or phosphorus (P) may de doped to the silicon film by using a dope material in TABLE 5 as the second process gas.

TABLE 5

| Source B Area |
| --- |
| Si Dope Material |
| $PH_3$(Phosphine), $B_2H_6$(Diborane), $BCl_3$ |

In addition, by using a gas composed of a compound shown in TABLE 6 as the first process gas, and by using the above-mentioned second process gas, a metal oxide film, a metal nitride film, a metal carbonization film or a high-k film (high dielectric constant film) may be deposited.

TABLE 6

| Source A Area |
| --- |
| Metal Layer Formation Material |
| TMA(Trimethylaluminium), Cu(hfac)TMVS(Hexafluoroacetylacetonato-Trimethyl(vinyl)silylcopper(I)), Cu(EDMDD)$_2$, TBTDET(Tris(diethylamino)(tert-butylimido)tantalum), PET(Pentaethoxytantalum(V)), $TiCl_4$(Titanium(IV) chloride), $AlCl_3$(Aluminium chloride), TEH(Tetrakis(ethoxy)hafnium), Zr(OtBt)$_4$, HTTB(Hafnium(IV) tert-butoxide), TDMAH(Tetrakis(diethylamino)hafnium), TDEAH(Tetrakis(diethylamino)hafnium), TEMAH(Tetrakis(ethylmethylamino)hafnium), Hf(MMP)$_4$(Hafnium methoxymethylpropoxide), ZTTB(Zirconium(IV)tetra-tert-butoxide), TDMAZ(Tetrakis(dimethylamino)zirconium), TDEAZ(Tetrakis(diethylamino)zirconium), TEMAZ(Tetrakis(ethylmethylamido)zirconium), Zr(MMP)$_4$(Tetrakis(1-methoxy-2-methyl-2-propoxy)zirconium) TEA(Tetraethylaluminum), Al(MMP)$_3$(Tris(1-methoxy-2-methylpropoxy)aluminum) |

Moreover, a gas for the plasma composed of a compound in TABLE 7 may be used as the gas for plasma modification or the plasma ion doping gas used with the gas for plasma modification.

TABLE 7

| Plasma Area Side Modification Plasma Gas Plasma Ion Implantation Gas |
| --- |
| $O_2$ Plasma, Ar Plasma, He Plasma, $H_2$ Plasma, $N_2$ Plasma, $NH_3$ Plasma, $H_2O$ Plasma, $CH_4$ Plasma $N_2O$ Plasma $CO_2$ Plasma |

In TABLE 7, plasma containing an oxygen element, plasma containing a nitrogen element and plasma containing a carbon element may be respectively used only in processes of depositing an oxide film, a nitride film and a carbonized film.

When depositing the various thin films described above, the annealing treatment may be performed after depositing the thin film, in the middle of depositing the thin film, or each time the reaction layer 301 is deposited. Moreover, when performing the annealing treatment, supplying each of the gases and feeding power to the radio frequency power source 85 are stopped, but the supply and the power feeding may be performed while performing the annealing treatment because the supply of the separation gas and each of the gases, and further the power feeding to the radio frequency power source 85 (i.e., conversion from the plasma generating gas to plasma) do not have a bad influence to the annealing treatment in particular.

WORKING EXAMPLE

Next, a description is given below of working examples performed with respect to the present invention.

Experimental Example 1

Figure 17:
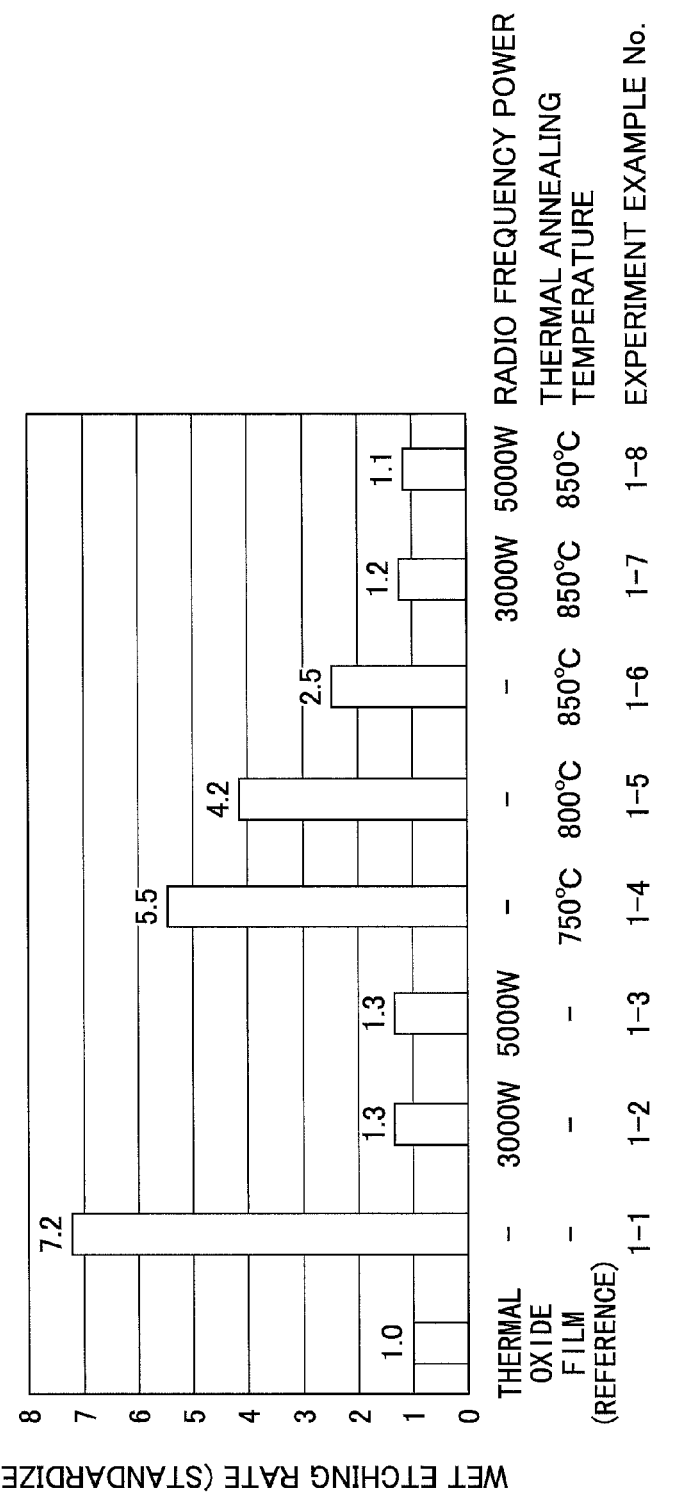
FIG. 17 is a property diagram showing an experiment performed in an embodiment of the present invention.

To begin with, a description is given below of an experiment that estimated a film quality of a thin film with respect to a case of depositing a thin film made of a silicon oxide film by the ALD method at a film deposition temperature of 600 degrees Celsius (without the plasma modification treatment and the annealing treatment), and a case of performing the plasma modification treatment and/or the annealing treatment for the thin film. FIG. 17 shows results that measured wet etching rates to hydrofluoric acid with respect to thin films obtained by performing film deposition and after-treatment by each of conditions in the following TABLE 8, and the results of the etching rates are standardized by an wet etching rate in the thermal oxide film of a reference example, by making the wet etching rate of the thermal oxide film one unit. Here, in the experiment, the thin film was deposited on a silicon wafer without including a concave portion formed in a surface thereof, and film deposition process and the plasma modification treatment were respectively performed in the above-mentioned vacuum chamber 1, and the annealing treatment was performed in another heat treatment apparatus by taking the wafer out of the vacuum chamber 1 after depositing the thin film on the wafer.

TABLE 8

| | Plasma Modification Treatment | Annealing Treatment |
| --- | --- | --- |
| Experiment Example 1-1 | Not Performed | Not Performed |
| Experiment Example 1-2 | 3000 W | |
| Experiment Example 1-3 | 5000 W | |
| Experiment Example 1-4 | Not Performed | 750° C. |
| Experiment Example 1-5 | | 800° C. |
| Experiment Example 1-6 | | 850° C. |
| Experiment Example 1-7 | 3000 W | |
| Experiment Example 1-8 | 5000 W | |

As a result, in the experimental examples 1-1, 1-4, 1-5 and 1-6, it is noted that the thin films were densified by performing the annealing treatment compared to a case without performing the plasma modification treatment and the annealing treatment as the after-treatment, and that the higher the annealing temperature became, the more the densification advanced. However, even though the annealing treatment was performed at a high temperature of 850 degrees Celsius, the density of the thin film was about 2.5 times lower (worse) than that of the thermal oxide film. Here, in FIG. 17, the graph shows the higher the etching rate becomes, the lower (worse) the film density becomes.

On the other hand, comparing the results of the experimental examples 1-1, 1-2 and 1-3 with each other, it is noted that the dense thin film was obtained by performing the plasma modification treatment. Moreover, as shown in the experimental examples 1-1, 1-7 and 1-8, by performing the annealing treatment in addition to the plasma modification treatment, film properties very close to those of the thermal oxide film ware obtained. However, from comparisons of differences between the experimental examples 1-1 and 1-6, the experimental examples 1-2 (1-3) and 1-7 (1-8), a degree of progression of the densification by the annealing treatment was smaller when the plasma modification treatment was performed prior to the annealing treatment than when the annealing treatment was performed without performing the plasma modification treatment. Because of this, according to the results of the experimental example 1, when the concave portion was not formed in the surface of the wafer, even though the annealing treatment was performed following the plasma modification treatment, the effect of the densification by the annealing treatment can be said to be small.

Experimental Example 2

Therefore, an experiment was performed by depositing a thin film on a wafer including a concave portion in a surface thereof similarly to the experimental example 1, and then by performing the plasma modification treatment and the annealing treatment as after-treatment in order to study a tendency of film properties in a depth direction of the concave portion (i.e, an wet etching rate to hydrofluoric acid) after performing the after-treatment. After each of the wafers was immersed in the hydrofluoric acid, each of the wafers is cut in the board thickness direction, and the wet etching rate was measured with respect to each of a surface (a horizontal surface) of the wafer between the concave portions adjacent to each other, a side surface in the concave portion, and a side surface in the vicinity of the bottom surface of the concave portion. In this experiment, a depth dimension of the concave portion is 1.7 μm, and the "inside of the concave portion" and the "vicinity of the bottom surface of the concave portion" respectively mean locations of 150 nm and 1.7 μm from the surface of the wafer. The opening size of the concave portion is 0.1 μm. The results of the experimental example 2 are shown in TABLE 9 and FIG. 18. Here, in the experimental example 2, the wet etching rates were also standardized by making the wet etching rate of the thermal oxide film one unit. In addition, with respect to the experimental example 2, the annealing treatment was performed in another heat treatment apparatus different from the vacuum chamber 1.

TABLE 9

| | | After Deposition | Heat Treatment 750° C. | Heat Treatment 800° C. | Heat Treatment 850° C. |
|---|---|---|---|---|---|
| RF 0 W | Surface | | 1.3 | 1.7 | 1.7 |
| RF 0 W | Inside of Concave Portion | | 1.7 | 1.7 | 1.3 |
| RF 0 W | Lower Side of Concave Portion | | 1.7 | 1.0 | 1.3 |
| RF 5000 W | Surface | 1.0 | 1.3 | 1.3 | 1.0 |
| RF 5000 W | Inside of Concave Portion | 2.0 | 1.0 | 1.0 | 0.7 |
| RF 5000 W | Lower Side of Concave Portion | 2.3 | 1.7 | 1.0 | 1.0 |

In TABLE 9 and FIG. 18, in a result of "RF 0 W" (i.e., without the plasma modification treatment), the thin films had uniform film quality throughout the depth direction of the concave portion in any conditions of the annealing temperature of 750 degrees Celsius, 800 degrees Celsius and 850 degrees Celsius. However, as described in the above experimental example 1, very preferable film quality could not be obtained by only the annealing temperature.

On the other hand, in a case of "RF 5000 W" (which includes the plasma modification treatment, and the power supply to the radio frequency power source 85 is 5000 W), when the annealing treatment was not performed, the film quality was deteriorated as the distance from the surface of the wafer increases, and the distance to the bottom surface of the concave portion decreases. However, by performing the annealing process together with the plasma modification treatment, a dense and homogeneous thin film was obtained throughout the depth direction of the concave portion, and the etching rate at this time was the almost same value as the value of the thermal oxide film. Accordingly, it is noted that by performing the anneal treatment following the plasma modification treatment, even though the concave portion was formed in the surface of the wafer, the thin film of a preferable film quality can be obtained compared to a case of performing either the plasma modification treatment or the annealing treatment.

In embodiments of the present invention, a thin film is deposited by repeating a step of depositing a molecular layer or an atomic layer by supplying a process gas to a substrate while rotating a turntable, and a step of modifying the molecular layer or the atomic layer by plasma. Then, after forming the thin film, the thin film is modified by stopping supply of the process gas and by heating the substrate up to a temperature higher than a temperature while depositing the thin film. Accordingly, even if a concave portion is formed in a surface of the substrate, a thin film having a high and uniform film quality in a depth direction of the concave portion can be formed.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A film deposition method to deposit a thin film on a substrate, the film deposition method comprising steps of:
    placing a substrate on a substrate receiving area on a turntable provided in a vacuum chamber, the substrate including a concave portion formed in a surface thereof;
    rotating the substrate receiving area by rotating the turntable;
    heating the substrate on the turntable up to a predetermined film deposition temperature to deposit a thin film;
    depositing the thin film on the substrate by repeating a first step of forming at least one of a molecular layer and an atomic layer on the substrate by supplying a process gas from a process gas supply part to the substrate on the turntable, and a second step of modifying the at least one of the molecular layer and the atomic layer by plasma, by supplying a plasma generating gas into the vacuum chamber and by converting the plasma generating gas to plasma in a plasma treatment part; and
    modifying the thin film by heating the substrate up to a temperature higher than the predetermined film deposition temperature,
    wherein the step of depositing the thin film is performed by supplying a second process gas reactable with the process gas to the substrate from a second process gas supply part provided away from the process gas supply part in a rotational direction of the turntable,
    wherein the process gas supply part is provided in a process area, and the second process gas supply part is provided in a second process area,
    wherein a separation area is provided between the process area and the second process area, and the step of depositing the thin film includes a step of supplying a separation gas to the separation area to separate the process area and the second process area, and
    wherein the step of modifying the thin film is performed by using a plurality of heat lamps provided over the separation area and arranged along the rotational direction of the turntable and by heating the substrate from a plurality of locations along the rotational direction of the turntable.

2. The film deposition method as claimed in claim 1,
    wherein the step of modifying the thin film is performed by using the plurality of heat lamps configured to irradiate the substrate with light in a adsorption wavelength range of the substrate from above,
    wherein the process gas supply part, the plasma treatment part and the plurality of heat lamps are arranged away from each other when seen from a planar perspective,
    wherein the step of depositing the thin film and the step of modifying the thin film is performed by rotating the turntable, and wherein the step of modifying the thin film is performed while stopping supply of the process gas.

3. The film deposition method as claimed in claim 1, wherein the step of heating the substrate is performed by heating the substrate from the lower side of the turntable through the turntable.

4. The film deposition method as claimed in claim 1, wherein the step of modifying the substrate is performed by heating the substrate up to a predetermined modification temperature higher than a temperature that decomposes the process gas.

* * * * *